United States Patent
Yamazaki

(10) Patent No.: US 9,859,114 B2
(45) Date of Patent: Jan. 2, 2018

(54) OXIDE SEMICONDUCTOR DEVICE WITH AN OXYGEN-CONTROLLING INSULATING LAYER

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/755,004

(22) Filed: Jan. 31, 2013

(65) Prior Publication Data

US 2013/0200375 A1 Aug. 8, 2013

(30) Foreign Application Priority Data

Feb. 8, 2012 (JP) ................... 2012-025469

(51) Int. Cl.
*H01L 29/786* (2006.01)
*H01L 21/02* (2006.01)
(Continued)

(52) U.S. Cl.
CPC .......... *H01L 21/0237* (2013.01); *H01L 29/04* (2013.01); *H01L 29/6656* (2013.01);
(Continued)

(58) Field of Classification Search
CPC ............. H01L 29/6656; H01L 29/7869; H01L 21/0237; H01L 21/02244; H01L 21/02252;
(Continued)

(56) References Cited

U.S. PATENT DOCUMENTS 4,566,175 A 1/1986 Smayling et al.
5,214,295 A 5/1993 Manning
(Continued)

FOREIGN PATENT DOCUMENTS

EP 1 737 044 A1 12/2006
EP 2 226 847 A2 9/2010
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Matthew Landau
*Assistant Examiner* — Mark Hatzilambrou
(74) *Attorney, Agent, or Firm* — Fish & Richardson P.C.

(57) ABSTRACT

Provided is a highly reliable semiconductor device which includes a transistor including an oxide semiconductor. The semiconductor device includes an oxide semiconductor layer; a gate insulating layer provided over the oxide semiconductor layer; a gate electrode layer overlapping with the oxide semiconductor layer with the gate insulating layer provided therebetween; an insulating layer being in contact with part of an upper surface of the oxide semiconductor layer, covering a side surface of the gate insulating layer and a side surface and an upper surface of the gate electrode layer, and having a lower oxygen-transmitting property than the gate insulating layer; a sidewall insulating layer provided on the side surface of the gate electrode layer with the insulating layer provided therebetween; a source electrode layer and a drain electrode layer which are electrically connected to the oxide semiconductor layer.

19 Claims, 15 Drawing Sheets

(51) Int. Cl.
*H01L 29/04* (2006.01)
*H01L 29/66* (2006.01)

(52) U.S. Cl.
CPC .... *H01L 29/7869* (2013.01); *H01L 29/78693* (2013.01); *H01L 21/02244* (2013.01); *H01L 21/02252* (2013.01); *H01L 21/02554* (2013.01); *H01L 21/02565* (2013.01); *H01L 21/02631* (2013.01)

(58) Field of Classification Search
CPC ......... H01L 21/02554; H01L 21/02565; H01L 21/02631; H01L 29/04; H01L 29/78693
USPC ...................... 257/43, 900, E21.626, E21.64
See application file for complete search history.

(56) References Cited

U.S. PATENT DOCUMENTS

| | | |
|---|---|---|
| 5,258,645 A | 11/1993 | Sato |
| 5,731,856 A | 3/1998 | Kim et al. |
| 5,744,864 A | 4/1998 | Cillessen et al. |
| 6,294,274 B1 | 9/2001 | Kawazoe et al. |
| 6,388,291 B1 | 5/2002 | Zhang et al. |
| 6,399,960 B1 | 6/2002 | Yamazaki et al. |
| 6,433,361 B1 | 8/2002 | Zhang et al. |
| 6,479,359 B2 | 11/2002 | Kim |
| 6,563,174 B2 | 5/2003 | Kawasaki et al. |
| 6,586,766 B2 | 7/2003 | Yamazaki et al. |
| 6,593,197 B2 | 7/2003 | Wieczorek et al. |
| 6,682,994 B2 | 1/2004 | Johnson et al. |
| 6,727,522 B1 | 4/2004 | Kawasaki et al. |
| 6,777,761 B2 | 8/2004 | Clevenger et al. |
| 6,909,145 B2 | 6/2005 | Cabral et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,371,623 B2 | 5/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,982,272 B2 | 7/2011 | Mitsuhashi et al. |
| 8,202,365 B2 | 6/2012 | Umeda et al. |
| 8,654,272 B2 | 2/2014 | Yamazaki et al. |
| 8,878,173 B2 | 11/2014 | Yamazaki |
| 2001/0046027 A1 | 11/2001 | Tai et al. |
| 2002/0056838 A1* | 5/2002 | Ogawa ........................... 257/59 |
| 2002/0132454 A1 | 9/2002 | Ohtsu et al. |
| 2003/0183821 A1* | 10/2003 | Suzawa et al. ................. 257/66 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0051852 A1* | 3/2005 | Kim et al. .................... 257/382 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308804 A1* | 12/2008 | Akimoto et al. ............... 257/59 |
| 2009/0068773 A1 | 3/2009 | Lai et al. |
| 2009/0073325 A1 | 3/2009 | Kuwabara et al. |
| 2009/0079014 A1* | 3/2009 | Sandford et al. .............. 257/407 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102307 A1* | 4/2010 | Chua et al. ....................... 257/43 |
| 2010/0109002 A1 | 5/2010 | Itagaki et al. |
| 2011/0003429 A1 | 1/2011 | Oikawa et al. |
| 2011/0303913 A1* | 12/2011 | Yamazaki ......... H01L 29/66742 257/43 |
| 2012/0001167 A1 | 1/2012 | Morosawa |
| 2012/0001170 A1* | 1/2012 | Yamazaki ........... H01L 27/1225 257/43 |
| 2013/0193493 A1 | 8/2013 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-321337 A | 12/1995 |
| JP | 08-264794 A | 10/1996 |

(56) References Cited

FOREIGN PATENT DOCUMENTS

| | | |
|---|---|---|
| JP | 11-505377 A | 5/1999 |
| JP | 2000-036598 A | 2/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-224479 A | 10/2009 |
| JP | 2009-260328 A | 11/2009 |
| JP | 2012-015436 A | 1/2012 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., Optical Studies of the Amorphous Liquid-Cholesteric Liquid Crystal Transition: the "Blue Phase", Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

(56) References Cited

OTHER PUBLICATIONS

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

OXIDE SEMICONDUCTOR DEVICE WITH AN OXYGEN-CONTROLLING INSULATING LAYER

BACKGROUND OF THE INVENTION

1. Field of the Invention

The disclosed invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which transistors are formed using semiconductor thin films formed over a substrate having an insulating surface has been attracting attention. The transistor is applied to a wide range of semiconductor devices such as an integrated circuit (IC) and an image display device (also simply referred to as display device). A silicon-based semiconductor material is widely known as a material for a semiconductor thin film applicable to a transistor. As another material, an oxide semiconductor has been attracting attention.

For example, a technique is disclosed by which a transistor is manufactured using zinc oxide or an In—Ga—Zn-based oxide as an oxide semiconductor (see Patent Documents 1 and 2).

Meanwhile, it has been pointed out that hydrogen behaves as a source of carriers in an oxide semiconductor. Therefore, some measures need to be taken to prevent hydrogen from entering the oxide semiconductor at the time of depositing the oxide semiconductor. Further, a technique is disclosed by which variation of a threshold voltage is suppressed by reducing the hydrogen content of not only the oxide semiconductor but also a gate insulating film in contact with the oxide semiconductor (see Patent Document 3).

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2009-224479

SUMMARY OF THE INVENTION

Moreover, as well as hydrogen, an oxygen vacancy contained in an oxide semiconductor behaves as a carrier supply source. The oxygen vacancy in the oxide semiconductor serves as a donor to generate an electron that is a carrier in the oxide semiconductor. When many oxygen vacancies exist in an oxide semiconductor including a channel formation region of a transistor, electrons are generated in the channel formation region, which is a cause of shift of the threshold voltage of the transistor in the negative direction.

In view of the above problem, an object of one embodiment of the present invention is to provide a method for manufacturing a semiconductor device including an oxide semiconductor, which is capable of having stable electric characteristics and achieving high reliability.

In one embodiment of the invention disclosed in this specification and the like, a transistor including an oxide semiconductor layer, a gate electrode layer overlapping with the oxide semiconductor layer, and a gate insulating layer provided between the oxide semiconductor layer and the gate electrode layer has a structure in which a side surface of the gate insulating layer is covered with an insulating film having a lower oxygen-transmitting property (having a barrier property against oxygen) than the gate insulating layer.

The side surface of the gate insulating layer is covered with an insulating film having a lower oxygen-transmitting property than the gate insulating layer, whereby oxygen can be prevented from being eliminated from end portions of the gate insulating layer. Since the gate insulating layer is an insulating layer which is in contact with a channel formation region of the oxide semiconductor layer, prevention of elimination of oxygen from the gate insulating layer can prevent extraction of oxygen from the oxide semiconductor layer (in particular, from the channel formation region of the oxide semiconductor layer) due to oxygen vacancies in the gate insulating layer. That is, occurrence of oxygen vacancies in the oxide semiconductor layer can be prevented.

Further, the gate insulating layer preferably includes a region containing a large amount of oxygen which exceeds the amount of oxygen in the stoichiometric ratio (hereinafter also referred to as an oxygen-excess region). When the gate insulating layer in contact with the oxide semiconductor layer includes an oxygen-excess region, oxygen can be supplied to the oxide semiconductor layer, so that oxygen can be prevented from being eliminated from the oxide semiconductor layer, and accordingly oxygen vacancies in the layer can be filled.

As the insulating layer covering the side surface of the gate insulating layer, a film which transmits less impurities such as hydrogen and moisture and less oxygen (a film having a high shielding effect (blocking effect) of preventing penetration of both impurities such as hydrogen and moisture and oxygen) is preferably used. With such a film, during and after the manufacturing process, an impurity such as hydrogen or moisture can be prevented from entering the oxide semiconductor layer, and oxygen which is a main component of the oxide semiconductor can be prevented from being released from the oxide semiconductor layer. As the film having a high shielding effect of preventing penetration of both impurities such as hydrogen and moisture and oxygen, for example, an aluminum oxide film can be used.

One embodiment of the present invention is a semiconductor device including an oxide semiconductor layer; a gate insulating layer provided over the oxide semiconductor layer; a gate electrode layer overlapping with the oxide semiconductor layer with the gate insulating layer provided therebetween; an insulating layer being in contact with part of an upper surface of the oxide semiconductor layer, covering a side surface of the gate insulating layer and a side surface and an upper surface of the gate electrode layer, and having a lower oxygen-transmitting property than the gate insulating layer; a sidewall insulating layer provided on the side surface of the gate electrode layer with the insulating layer provided therebetween; and a source electrode layer and a drain electrode layer which are electrically connected to the oxide semiconductor layer.

Further, one embodiment of the present invention is a semiconductor device including an oxide semiconductor layer which is non-single-crystal and includes a crystalline component and an amorphous component; a gate insulating layer provided over the oxide semiconductor layer; a gate electrode layer overlapping with the oxide semiconductor layer with the gate insulating layer provided therebetween;

an insulating layer being in contact with part of an upper surface of the oxide semiconductor layer, covering a side surface of the gate insulating layer and a side surface and an upper surface of the gate electrode layer, and having a lower oxygen-transmitting property than the gate insulating layer; a sidewall insulating layer provided on the side surface of the gate electrode layer with the insulating layer provided therebetween; and a source electrode layer and a drain electrode layer which are in contact with the oxide semiconductor layer. In the oxide semiconductor layer, in regions of the oxide semiconductor layer which are contact with the source electrode layer and the drain electrode layer, a ratio of the crystalline component content to the amorphous component content is lower than that in a region overlapping with the gate electrode layer. Furthermore, in the crystalline component, a c-axis is preferably aligned in a direction parallel to a normal vector of a surface where the oxide semiconductor layer is formed or a normal vector of a surface of the oxide semiconductor layer.

In the above oxide semiconductor device, a metal oxide film having a low permeability to oxygen and hydrogen is preferably included as the insulating layer.

Further, one embodiment of the present invention is a method for manufacturing a semiconductor device including the steps of forming an oxide semiconductor layer on an insulating surface, forming a gate insulating film over the oxide semiconductor layer, forming a gate electrode layer over the oxide semiconductor layer with the gate insulating film provided therebetween, forming a gate insulating layer between the oxide semiconductor layer and the gate electrode layer by etching the gate insulating film using the gate electrode layer as a mask, forming a first insulating film having a lower oxygen-transmitting property than the gate insulating layer over the oxide semiconductor layer and the gate electrode layer, forming a second insulating film over the first insulating film, forming a sidewall insulating layer covering a side surface of the gate electrode layer with the first insulating film provided therebetween by etching the second insulating film, forming an insulating layer which is in contact with part of an upper surface of the oxide semiconductor layer and which covers a side surface of the gate insulating layer and a side surface and an upper surface of the gate electrode layer by etching the first insulating film, and forming a source electrode layer and a drain electrode layer which are electrically connected to the oxide semiconductor layer.

In the above method for manufacturing a semiconductor device, a metal oxide film is preferably formed as the first insulating film. Further, the metal oxide film is preferably formed in such a manner that a metal film is formed over the oxide semiconductor layer and the gate electrode layer and then the metal film is subjected to oxygen doping treatment.

According to one embodiment of the present invention, a semiconductor device which uses an oxide semiconductor and can have stable electric characteristics and high reliability can be provided.

DETAILED DESCRIPTION OF THE INVENTION

Figure 1A:
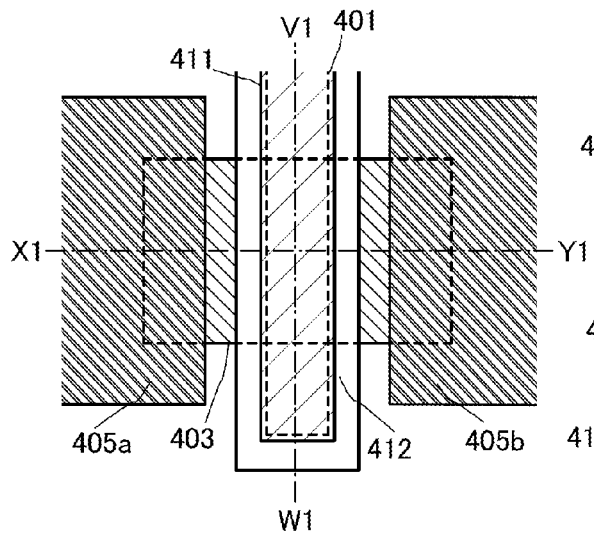
FIGS. 1A to 1C are a plan view and cross-sectional views illustrating one embodiment of a semiconductor device.

Hereinafter, embodiments of the invention disclosed in this specification will be described with reference to the accompanying drawings. However, the invention disclosed in this specification is not limited to the following description, and it will be easily understood by those skilled in the art that modes and details thereof can be variously changed. Therefore, the invention disclosed in this specification is not construed as being limited to the description of the following embodiments. Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in this specification and the like, ordinal numbers such as "first" and "second" are used in order to avoid confusion among components and do not limit the number.

Embodiment 1

In this embodiment, one embodiment of a semiconductor device and a method for manufacturing the semiconductor device will be described with reference to FIGS. 1A to 1C, FIGS. 2A to 2C, FIGS. 3A to 3D, and FIGS. 4A to 4C. In this embodiment, a transistor including an oxide semiconductor layer is shown as an example of the semiconductor device.

Figure 1C:
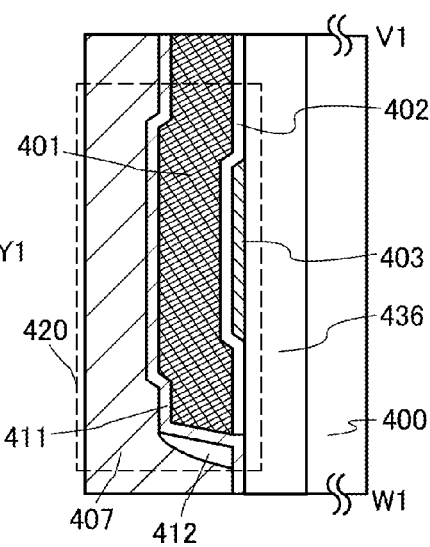
Figure 1B:
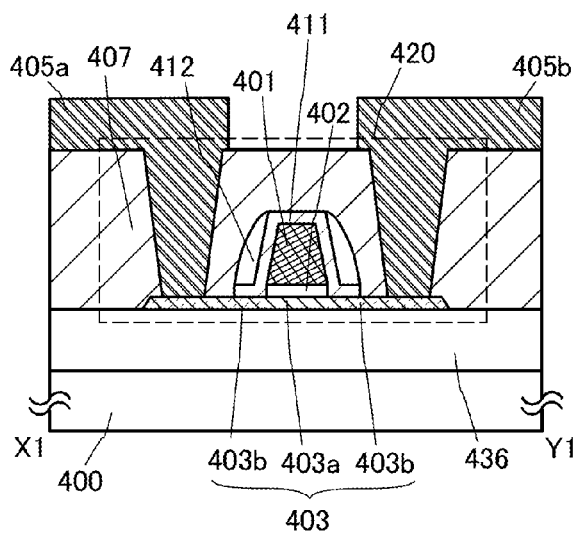

FIGS. 1A to 1C illustrate a structural example of a transistor 420. FIG. 1A is a plan view of the transistor 420, FIG. 1B is a cross-sectional view taken along line X1-Y1 in FIG. 1A, and FIG. 1C is a cross-sectional view taken along line V1-W1 in FIG. 1A. Note that in FIG. 1A, some components of the transistor 420 (e.g., an insulating layer 407) are not illustrated for clarity.

The transistor 420 illustrated in FIGS. 1A to 1C includes an oxide semiconductor layer 403 provided over a substrate 400, a gate insulating layer 402 provided over the oxide semiconductor layer 403, a gate electrode layer 401 overlapping with the oxide semiconductor layer 403 with the gate insulating layer 402 provided therebetween, an insulating layer 411 which is in contact with part of an upper surface of the oxide semiconductor layer 403 and which covers a side surface of the gate insulating layer 402 and a side surface and an upper surface of the gate electrode layer 401, a sidewall insulating layer 412 provided on the side surface of the gate electrode layer 401 with the insulating layer 411 provided therebetween, and a source electrode layer 405a and a drain electrode layer 405b which are electrically connected to the oxide semiconductor layer 403.

In the transistor 420, as the insulating layer 411 provided to be in contact with part of the upper surface of the oxide semiconductor layer 403, the side surface of the gate insulating layer 402, and the side surface and the upper surface of the gate electrode layer 401, an insulating layer having a barrier property against oxygen is used. Specifically, as the insulating layer 411, an insulating layer having a lower oxygen-transmitting property than the gate insulating layer is used. The insulating layer having a barrier property against oxygen provided as the insulating layer 411 can prevent oxygen from being eliminated from the side surface of the gate insulating layer 402. Since the gate insulating layer 402 is an insulating layer which is in contact with a channel formation region of the oxide semiconductor layer 403, prevention of elimination of oxygen from the insulating layer can prevent extraction of oxygen from the oxide semiconductor layer 403 due to oxygen vacancies in the gate insulating layer 402. That is, occurrence of oxygen vacancies in the oxide semiconductor layer 403 can be prevented.

The insulating layer 411 can have a single-layer structure or a stacked-layer structure of an oxide film or a nitride film containing, for example, aluminum, aluminum to which magnesium is added, aluminum to which titanium is added, magnesium, or titanium.

It is preferable that the gate insulating layer 402 also include an oxygen-excess region for the following reason. When the gate insulating layer 402 includes an oxygen-excess region, oxygen can be supplied to the oxide semiconductor layer 403. Accordingly, elimination of oxygen from the oxide semiconductor layer 403 can be prevented, and oxygen vacancies in the layer can be filled.

Note that a base insulating layer 436 and/or an insulating layer 407 provided over the substrate 400 may be components of the transistor 420. Since the base insulating layer 436 and the insulating layer 407 are insulating layers which are in contact with the oxide semiconductor layer 403, in a manner similar to that of the gate insulating layer 402, the base insulating layer 436 and the insulating layer 407 preferably each include an oxygen-excess region.

As the insulating layer 411, in addition to having a barrier property against oxygen, a film which transmits less impurities such as hydrogen and moisture is preferably used. As such a film, an aluminum oxide film can preferably be used. With the use of an aluminum oxide film as the insulating layer 411, not only elimination of oxygen from the oxide semiconductor layer is prevented, but also entry of impurities such as hydrogen and moisture into the oxide semiconductor layer 403, which might cause variation in electric characteristics of the transistor, can be suppressed.

Note that the aluminum oxide film preferably has a high density (film density higher than or equal to 3.2 g/cm$^3$, preferably higher than or equal to 3.6 g/cm$^3$), because a property of transmitting oxygen and/or hydrogen can be further reduced and the transistor 420 can have stable electric characteristics. The film density can be measured by Rutherford backscattering spectrometry (RBS) or X-ray reflection (XRR).

The oxide semiconductor layer 403 included in the transistor 420 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor layer may include a CAAC-OS. In the CAAC-OS, for example, c-axes are aligned, and a-axes and/or b-axes are not macroscopically aligned.

For example, an oxide semiconductor layer may include microcrystal. Note that an oxide semiconductor including microcrystal is referred to as a microcrystalline oxide semiconductor. A microcrystalline oxide semiconductor layer includes microcrystal (also referred to as nanocrystal) with a size greater than or equal to 1 nm and less than 10 nm, for example. Alternatively, a microcrystalline oxide semiconductor layer, for example, includes a crystal-amorphous mixed phase structure where crystal parts (each of which is greater than or equal to 1 nm and less than 10 nm) are distributed.

For example, an oxide semiconductor layer may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor layer 403 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that the oxide semiconductor layer 403 may be in a single-crystal state, for example.

In this embodiment, the oxide semiconductor layer 403 is non-single-crystal and preferably includes crystalline components and amorphous components. Further, the oxide semiconductor layer 403 preferably includes a first region 403a overlapping with the gate insulating layer 402 and second regions 403b in which the ratio of crystalline components to amorphous components is lower than that in the first region 403a. It is preferable that the second regions 403b be in contact with the source electrode layer 405a and the drain electrode layer 405b and that the first region 403a serve as a channel formation region.

The first region 403a serving as the channel formation region of the oxide semiconductor layer 403 preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor layer is a CAAC-OS film. That is, the first region 403a is preferably the CAAC-OS film.

The CAAC-OS film is not absolutely amorphous. The CAAC-OS film, for example, is an oxide semiconductor film with a crystal-amorphous mixed phase structure where crystal components and amorphous components are intermingled. Note that in most cases, the crystal component fits inside a cube whose one side is less than 100 nm. In an image obtained with a transmission electron microscope (TEM), a boundary between an amorphous component and a crystal component and a boundary between crystal components in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal components included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal components, the directions of the a-axis and the b-axis of one crystal component may be different from those of another crystal component. In this specification, a simple term "perpendicular" includes a range from 85° to 95°. In addition, a simple term "parallel" includes a range from −5° to 5°.

In the CAAC-OS film, distribution of crystal components is not necessarily uniform. For example, in the formation process of the CAAC-OS film, in the case where crystal growth occurs from a surface side of the oxide semiconductor layer, the proportion of crystal components in the vicinity of the surface of the oxide semiconductor layer is higher than that in the vicinity of the surface on which the oxide semiconductor layer is formed in some cases. Further, when an impurity is added to the CAAC-OS film, the crystal component in a region to which the impurity is added becomes amorphous in some cases.

Since the c-axes of the crystal components included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal components or followed by the formation of the crystal components through crystallization treatment such as heat treatment. Hence, the c-axes of the crystal components are aligned in the direction parallel to a normal vector of the surface where the CAAC-OS film is formed or a normal vector of the surface of the CAAC-OS film.

With the use of the CAAC-OS film in a transistor, variation in electric characteristics of the transistor due to irradiation with visible light or ultraviolet light is small. Thus, the transistor has high reliability.

Description of this embodiment will be given on the assumption that the first region 403a of the oxide semiconductor layer 403 is the CAAC-OS film; however, the oxide semiconductor layer 403 may be single crystal or polycrystalline (also referred to as polycrystal).

When the first region 403a is the CAAC-OS film, the ratio of the crystalline components to the amorphous components is high in the first region 403a and the ratio of the crystalline components to the amorphous components is low in the second regions 403b. Note that the second regions 403b may be amorphous.

In a transistor including an oxide semiconductor, oxygen is eliminated from a side surface of the oxide semiconductor layer in some cases due to etching treatment for etching the oxide semiconductor layer into a desired shape, exposure of the side surface of the oxide semiconductor layer to a reduced-pressure atmosphere, or the like. Oxygen vacancies due to elimination of oxygen serve as a source of carriers and influence electric characteristics of the transistor. In particular, when a region where oxygen vacancies are formed is provided between a source and a drain, the region serves as an unintentional path of carriers, that is, a parasitic channel. Especially, when the oxide semiconductor layer is the CAAC-OS film, in the vicinity of the side surface of the oxide semiconductor layer, oxygen is more easily eliminated and carriers are more easily generated than in the vicinity of the upper surface. Therefore, prevention of elimination of oxygen from the oxide semiconductor layer is important to obtain a transistor having stable electrical characteristics.

In the transistor 420 described in this embodiment, the side surfaces in the channel width direction of the oxide semiconductor layer 403 are covered with the gate insulating layer 402 and the insulating layer 411 having a high barrier property against oxygen, whereby elimination of oxygen from the region between the source and the drain can be prevented. Further, in the case where the gate insulating layer 402 includes an oxygen-excess region, by provision of the insulating layer 411, oxygen can be effectively supplied to the oxide semiconductor layer 403; therefore, oxygen vacancies in the oxide semiconductor layer 403 can be filled. Accordingly, the influence of a parasitic channel can be suppressed in the transistor 420 and a highly reliable semiconductor device can be provided with the use of the transistor 420.

An example of a method for manufacturing the transistor 420 will be described below with reference to FIGS. 2A to 2C, FIGS. 3A to 3D, and FIGS. 4A to 4C.

The base insulating layer 436 is formed over the substrate 400 having an insulating surface.

There is no particular limitation on a substrate that can be used as the substrate 400 having an insulating surface as long as it has at least heat resistance to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 420 including the oxide semiconductor layer 403 may be directly formed over a flexible substrate; or alternatively, the transistor 420 including the oxide semiconductor layer 403 may be formed over a manufacturing substrate and then separated and transferred to a flexible substrate. Note that in order to separate the transistor 420 from the manufacturing substrate and transfer it to the flexible substrate, a separation layer may be provided between the manufacturing substrate and the transistor 420 including the oxide semiconductor layer.

The base insulating layer 436 can have a single-layer structure or a stacked-layer structure of one or more films containing silicon oxide, silicon nitride, silicon oxynitride, silicon nitride oxide, aluminum oxide, aluminum nitride, aluminum oxynitride, aluminum nitride oxide, hafnium oxide, gallium oxide, or a mixed material of any of these materials, by a plasma CVD method, a sputtering method, or the like. Note that the base insulating layer 436 preferably has a single-layer structure or a stacked-layer structure including an oxide insulating layer so that the oxide insulating layer is in contact with the oxide semiconductor layer 403 to be formed later. Note that the base insulating layer 436 is not necessarily provided.

The base insulating layer 436 preferably includes an oxygen-excess region, in which case oxygen vacancies in the oxide semiconductor layer 403 to be formed later can be filled with the excess oxygen included in the base insulating layer 436. In the case where the base insulating layer 436 has a stacked-layer structure, the base insulating layer 436 preferably includes an oxygen-excess region at least in a layer in contact with the oxide semiconductor layer 403 (preferably, the oxide insulating layer). In order to provide the oxygen-excess region in the base insulating layer 436, for example, the base insulating layer 436 may be formed in an oxygen atmosphere. Alternatively, the oxygen-excess region may be formed by introducing oxygen (including at least one of an oxygen radical, an oxygen atom, and an oxygen ion) into the base insulating layer 436 after its formation. Oxygen can be introduced by an ion implantation method, an ion doping method, a plasma immersion ion implantation method, plasma treatment, or the like.

Further, the base insulating layer 436 preferably includes a silicon nitride film, a silicon nitride oxide film, or an aluminum oxide film that is in contact with the bottom side of the layer including the oxygen-excess region. In the case where the base insulating layer 436 includes a silicon nitride film, a silicon nitride oxide film, or an aluminum oxide film, diffusion of impurities into the oxide semiconductor layer 403 can be prevented.

Planarizing treatment may be performed on the region of the base insulating layer 436 which is in contact with the oxide semiconductor layer 403. As the planarizing treatment, polishing treatment (e.g., a chemical mechanical polishing method), dry-etching treatment, or plasma treatment can be used, though there is no particular limitation on the planarizing treatment.

As the plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to a surface of the base insulating layer 436.

As the planarizing treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the base insulating layer 436.

In order to reduce impurities such as hydrogen including water and a hydroxyl group and make the base insulating layer 436 an oxygen-excess layer, heat treatment (dehydration or dehydrogenation) to remove hydrogen including water and a hydroxyl group and/or oxygen doping treatment may be performed on the base insulating layer 436. The dehydration or dehydrogenation and the oxygen doping treatment each may be performed plural times, and may be combined and repeated.

Figure 2A:
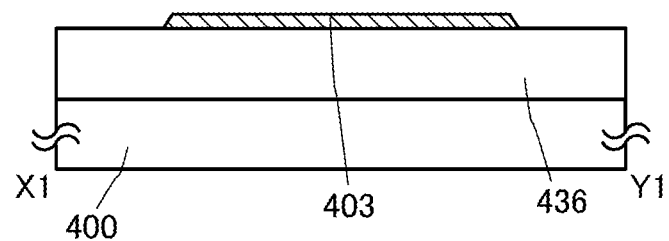
FIGS. 2A to 2C are cross-sectional views showing one example of a method for manufacturing a semiconductor device.

Next, an oxide semiconductor layer is deposited over the base insulating layer 436 and processed into an island shape to form the oxide semiconductor layer 403 (see FIG. 2A). The oxide semiconductor layer 403 has a thickness of, for example, 1 nm to 30 nm, preferably, 5 nm to 10 nm.

The oxide semiconductor layer may have either a single-layer structure or a stacked-layer structure. Further, the oxide semiconductor layer may have either an amorphous structure or a crystalline structure. In the case where the oxide semiconductor layer has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor layer can be formed by a sputtering method, a molecular beam epitaxy (MBE) method, a CVD method, a pulse laser deposition method, an atomic layer deposition (ALD) method, or the like as appropriate.

In the formation of the oxide semiconductor layer, the hydrogen concentration in the oxide semiconductor layer is preferably reduced as much as possible. In order to reduce the hydrogen concentration, for example, in the case where a sputtering method is used for the deposition, a high-purity rare gas (typically, argon) from which impurities such as hydrogen, water, a hydroxyl group, and hydride have been removed; oxygen; or a mixed gas of oxygen and the rare gas is used as appropriate as an atmosphere gas supplied to a deposition chamber of a sputtering apparatus.

The oxide semiconductor layer is formed in such a manner that a sputtering gas from which hydrogen and moisture are removed is introduced into the deposition chamber while moisture remaining in the deposition chamber is removed, whereby the concentration of hydrogen in the oxide semiconductor layer can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. When the deposition chamber is evacuated with the cryopump, which has a high capability in removing a hydrogen molecule, a compound containing a hydrogen atom such as water ($H_2O$) (more preferably, also a compound containing a carbon atom), and the like, the impurity concentration in the oxide semiconductor layer formed in the deposition chamber can be reduced.

Further, when the oxide semiconductor layer is formed by a sputtering method, the relative density (filling rate) of a metal oxide target that is used for the deposition is greater than or equal to 90% and less than or equal to 100%, preferably greater than or equal to 95% and less than or equal to 99.9%. With the use of a metal oxide target with a high relative density, a dense oxide semiconductor layer can be deposited.

Further, to reduce the impurity concentration in the oxide semiconductor layer, it is also effective to form the oxide semiconductor layer while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. A crystalline oxide semiconductor layer can be formed by heating the substrate at a high temperature in the deposition.

Note that in the case where a CAAC-OS film is used as the oxide semiconductor layer 403, for example, the CAAC-OS film can be formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

The flat-plate-like sputtered particle has, for example, a diameter of a circle corresponding to a plane that is parallel to an a-b plane greater than or equal to 3 nm and less than or equal to 10 nm and a thickness (length in the direction perpendicular to the a-b plane) greater than or equal to 0.7 nm and less than 1 nm. Note that in the flat-plate-like sputtered particle, the plane parallel to the a-b plane may be a regular triangle or a regular hexagon. Here, the diameter of a circle corresponding to a plane refers to a diameter of a perfect circle having the same area as the plane.

For the deposition of the CAAC-OS film, the following conditions are preferably used.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like sputtered particles reach the substrate, migration occurs on the substrate surface, so that a flat plane of the sputtered particles is attached to the substrate. At this time, the sputtered particles are positively charged, whereby the sputtered particles repelling each other are attached to the substrate. Therefore, the sputtered particles are not gathered and are not unevenly overlapped with each other, so that the CAAC-OS film having a uniform thickness can be formed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition.

The proportion of oxygen in the deposition gas is 30 vol % or higher, preferably 100 vol %.

Heat treatment may be performed after the CAAC-OS film is deposited. The temperature of the heat treatment is higher than or equal to 100° C. and lower than or equal to 740° C., preferably higher than or equal to 200° C. and lower than or equal to 500° C. Further, the heat treatment time is longer than or equal to 1 minute and shorter than or equal to 24 hours, preferably longer than or equal to 6 minutes and shorter than or equal to 4 hours. Further, the heat treatment may be performed in an inert atmosphere or an oxidizing atmosphere. The heat treatment is preferably performed in such a manner that heat treatment is performed in an inert atmosphere and then heat treatment is performed in an oxidizing atmosphere. The heat treatment in an inert atmosphere can reduce the concentration of impurities in the CAAC-OS film in a short time. Meanwhile, through the heat treatment in an inert atmosphere, oxygen vacancies are generated in the CAAC-OS film in some cases. In that case, through the heat treatment in an oxidizing atmosphere, the oxygen vacancies can be reduced. Further, the heat treatment can further improve the crystallinity of the CAAC-OS film. Note that the heat treatment may be performed under a reduced pressure of 1000 Pa or less, 100 Pa or less, 10 Pa or less, or 1 Pa or less. The heat treatment under a reduced pressure can reduce the concentration of impurities in the CAAC-OS film in a shorter time.

Further, another method for forming the CAAC-OS film is to form a thin oxide semiconductor film and then subject the film to heat treatment performed at a temperature higher than or equal to 200° C. and lower than or equal to 700° C., thereby obtaining c-axis alignment substantially perpendicular to a surface. Furthermore, another method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

An oxide semiconductor used for the oxide semiconductor layer 403 contains at least indium (In). In particular, indium and zinc (Zn) are preferably contained. In addition, as a stabilizer for reducing variation in electric characteristics of a transistor using the oxide semiconductor, the oxide semiconductor preferably contains gallium (Ga) in addition to In and Zn. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, an "In—Ga—Zn-based oxide" means an oxide containing In, Ga, and Zn as its main component, in which there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, an oxide semiconductor containing indium that is included in a transistor is not limited to the materials given above; a material with an appropriate composition may be used for a transistor including an oxide semiconductor containing indium depending on needed electrical characteristics (e.g., field-effect mobility, threshold voltage, and variation). In order to obtain the needed electrical characteristics, the carrier concentration, the impurity concentration, the defect density, the atomic ratio between a metal element and oxygen, the interatomic distance, the density, and the like are preferably set to appropriate values.

For example, high field-effect mobility can be obtained relatively easily in a transistor including an In—Sn—Zn-based oxide semiconductor. Also in the case of a transistor including an In—Ga—Zn-based oxide semiconductor, the field-effect mobility can be increased by reducing the defect density in a bulk.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$. For example, r may be 0.05. The same applies to other oxides.

In this embodiment, the oxide semiconductor layer 403 has a single-layer structure. Note that the oxide semiconductor layer 403 may have a stacked-layer structure of a plurality of oxide semiconductor layers. For example, the oxide semiconductor layer 403 may have a stacked-layer structure of a first oxide semiconductor layer and a second oxide semiconductor layer which are formed using metal oxides with different compositions. For example, the first oxide semiconductor layer may be formed using a three-component metal oxide and the second oxide semiconductor layer may be formed using a two-component metal oxide. Alternatively, for example, both the first oxide semiconductor layer and the second oxide semiconductor layer may be formed using a three-component metal oxide.

Further, the constituent elements of the first oxide semiconductor layer and the second oxide semiconductor layer are made to be the same and the composition of the constituent elements of the first oxide semiconductor film and the second oxide semiconductor film may be made to be different. For example, the atomic ratio of the first oxide semiconductor layer may be In:Ga:Zn=1:1:1 and the atomic ratio of the second oxide semiconductor layer may be In:Ga:Zn=3:1:2. Alternatively, the atomic ratio of the first oxide semiconductor layer may be In:Ga:Zn=1:3:2 and the atomic ratio of the second oxide semiconductor layer may be In:Ga:Zn=2:1:3.

At this time, one of the first oxide semiconductor layer and the second oxide semiconductor layer which is closer to a gate electrode (on a channel side) preferably contains In and Ga at a proportion of In>Ga. The other which is farther from the gate electrode (on a back channel side) preferably contains In and Ga at a proportion of In≤Ga.

In an oxide semiconductor, the s orbitals of heavy metal mainly contribute to carrier transfer, and when the In content in the oxide semiconductor is increased, overlap of the s orbitals is likely to be increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor containing In and Ga at a proportion of In>Ga is used on a channel side, and an oxide semiconductor containing In and Ga at a proportion of In≤Ga is used on a back channel side; so that mobility and reliability of a transistor can be further improved.

Further, oxide semiconductors having different crystallinities may be used for the first oxide semiconductor layer and the second oxide semiconductor layer. That is, two of a single crystal oxide semiconductor, a polycrystalline oxide semiconductor, an amorphous oxide semiconductor, and a CAAC-OS may be combined as appropriate. When an amorphous oxide semiconductor is used for at least one of the first oxide semiconductor layer and the second oxide semiconductor layer, internal stress or external stress of the oxide semiconductor layer 403 is relieved, variation in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor layer on the channel side is preferably formed using a crystalline oxide semiconductor such as a CAAC-OS.

Further, the oxide semiconductor layer 403 is preferably subjected to heat treatment for removing excess hydrogen, including water and a hydroxyl group, (dehydration or dehydrogenation) contained in the oxide semiconductor layer 403. The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an impurity imparting n-type conductivity, can be removed from the oxide semiconductor by the heat treatment. For example, the hydrogen concentration in the oxide semiconductor layer 403 after the dehydration or dehydrogenation treatment can be lower than or equal to $5 \times 10^{19}/cm^{-3}$, preferably lower than or equal to $5 \times 10^{18}/cm^{-3}$.

Note that the heat treatment for the dehydration or dehydrogenation may be performed at any timing in the manufacturing process of the transistor 420 as long as the heat treatment is performed after the formation of the oxide semiconductor layer. The heat treatment for dehydration or dehydrogenation may be performed plural times, and may also serve as another heat treatment.

Note that in the case where an insulating layer containing oxygen is provided as the base insulating layer 436, the heat treatment for dehydration or dehydrogenation is preferably performed before the oxide semiconductor layer is processed into an island shape because oxygen contained in the base insulating layer 436 can be prevented from being released by the heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step for removing an impurity by the dehydration or dehydrogenation treatment, so that the oxide semiconductor layer 403 can be a high-purified and i-type (intrinsic) oxide semiconductor layer.

Since there is a possibility that oxygen, which is a main component of an oxide semiconductor, is also released and reduced by dehydration or dehydrogenation treatment, oxygen (including at least one of an oxygen radical, an oxygen atom, and an oxygen ion) may be introduced to the oxide semiconductor layer which has been subjected to the dehydration or dehydrogenation treatment to supply oxygen to the layer.

Introduction (supply) of oxygen into the dehydrated or dehydrogenated oxide semiconductor layer enables the oxide semiconductor layer to be highly purified and to be i-type (intrinsic). Variation in electric characteristics of a transistor having the highly-purified and i-type (intrinsic) oxide semiconductor is suppressed, and the transistor is electrically stable.

When oxygen is introduced into the oxide semiconductor layer, oxygen may be directly introduced into the oxide semiconductor layer or may be introduced into the oxide semiconductor layer 403 through another film such as the gate insulating layer 402 or the insulating layer 407 to be formed later. When oxygen is introduced into the oxide semiconductor layer 403 through another film, an ion implantation method, an ion doping method, a plasma immersion ion implantation method, or the like may be used.

In the case of directly introducing oxygen into the exposed oxide semiconductor layer 403, plasma treatment or the like can be used in addition to the above-described methods.

As a gas for supplying oxygen, a gas containing O may be used; for example, an $O_2$ gas, an $N_2O$ gas, a $CO_2$ gas, a CO gas, or an $NO_2$ gas may be used. Note that a rare gas (e.g., argon) may be contained in a gas for supplying oxygen.

For example, in the case where an oxygen ion is implanted into the oxide semiconductor layer 403 by an ion implantation method, the dosage may be set to be greater than or equal to $1 \times 10^{13}$ ions/cm$^2$ and less than or equal to $5 \times 10^{16}$ ions/cm$^2$.

Alternatively, oxygen may be supplied to the oxide semiconductor layer 403 in a manner such as the following: a layer including an oxygen-excess region is used as the insulating layer which is in contact with the oxide semiconductor layer 403; heat treatment is performed in a state where the insulating layer and the oxide semiconductor layer 403 are in contact with each other, whereby oxygen excessively contained in the insulating layer is diffused into the oxide semiconductor layer 403. The heat treatment may serve as another heat treatment in the manufacturing process of the transistor 420.

The supply of oxygen to the oxide semiconductor layer can be performed anytime after the formation of the oxide semiconductor layer. The step of introducing oxygen into the oxide semiconductor layer may be performed plural times. Further, in the case where the oxide semiconductor layer has a stacked-layer structure consisting of a plurality of layers, the heat treatment and/or the supply of oxygen for dehydration or dehydrogenation may be separately performed for every oxide semiconductor layer or may be performed on the oxide semiconductor layer 403 having a stacked-layer structure.

The base oxide insulating layer 436 and the oxide semiconductor layer 403 are preferably formed in succession without exposure to the air. According to successive formation of the base insulating layer 436 and the oxide semiconductor layer 403 without exposure to the air, impurities such as hydrogen and moisture can be prevented from being adsorbed onto a surface of the base insulating layer 436.

The oxide semiconductor layer 403 can be formed by processing an oxide semiconductor film into an island shape by a photolithography step. Note that a resist mask used for formation of the island-shaped oxide semiconductor layer 403 may be formed by an inkjet method. Formation of the resist mask by an inkjet method needs no photomask; thus, manufacturing cost can be reduced.

Figure 2B:
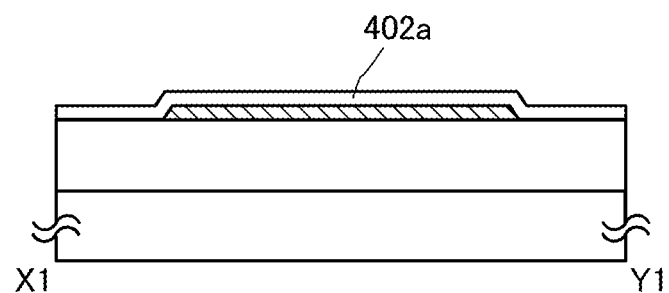
Figure 2C:
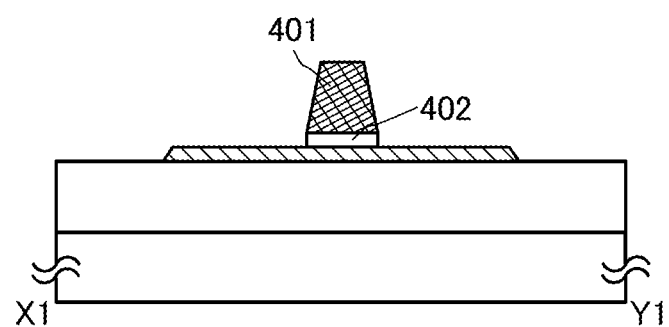

Next, a gate insulating film 402a is formed to cover the oxide semiconductor layer 403 (see FIG. 2B). For example, the gate insulating film 402a can be formed to have a thickness greater than or equal to 1 nm and less than or equal to 20 nm by a sputtering method, an MBE method, a CVD method, a pulse laser deposition method, an ALD method, or the like as appropriate.

To improve the coverage with the gate insulating film 402a, the above-described planarizing treatment may be performed also on a surface of the oxide semiconductor layer 403. In particular, in the case where a thin insulating layer is used as the gate insulating film 402a, it is preferable that the oxide semiconductor layer 403 have improved surface flatness.

The gate insulating film 402a can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 402a include oxygen in a portion which is in contact with the oxide semiconductor layer 403. In particular, the gate insulating film 402a preferably contains a large amount of oxygen which exceeds at least the amount of oxygen in the stoichiometric ratio in the film (bulk). For example, in the case where a silicon oxide film is used as the gate insulating film 402a, the composition formula is $SiO_{2+\alpha}$ ($\alpha>0$). Further, the gate insulating film 402a is preferably formed in consideration of the size of a transistor to be formed and the step coverage with the gate insulating film 402a.

The gate insulating film 402a can be formed using hafnium oxide, yttrium oxide, hafnium silicate ($HfSi_xO_y$ ($x>0$, $y>0$)), hafnium silicate to which nitrogen is added, hafnium aluminate ($HfAl_xO_y$ ($x>0$, $y>0$)), lanthanum oxide, or the like. Further, the gate insulating film 402a may have a single-layer structure or a stacked-layer structure.

In order to reduce impurities such as hydrogen including water and a hydroxyl group and make the gate insulating film 402a an oxygen-excess film, heat treatment (dehydration or dehydrogenation) to remove hydrogen including water and a hydroxyl group and/or oxygen doping treatment may be performed on the gate insulating film 402a. The dehydration or dehydrogenation and the oxygen doping treatment each may be performed plural times, and may be combined and repeated.

Then, a conductive film is formed over the gate insulating film 402a and then etched, so that the gate electrode layer 401 is formed. Further, the gate insulating film 402a is etched using the gate electrode layer 401 as a mask or the same mask as that used for the formation of the gate electrode layer 401 to form a gate insulating layer 402 (see FIG. 2C).

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 may have either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked-layer structure of the above conductive material and the above metal material.

As one layer of the gate electrode layer 401 which is in contact with the gate insulating layer 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV (electron volts), preferably higher than or equal to 5.5 eV (electron volts), and the use of this film as the gate electrode layer enables the threshold voltage of electrical characteristics of a transistor to be positive. Accordingly, a normally-off switching element can be obtained.

Note that in a cross section in the channel width direction (cross section illustrated in FIG. 1C), it is preferable that the distance between the end portion of the island-shaped oxide semiconductor layer 403 and the end portions of the gate electrode layer 401 and the gate insulating layer 402 be large because generation of a parasitic channel can be suppressed.

Figure 3A:
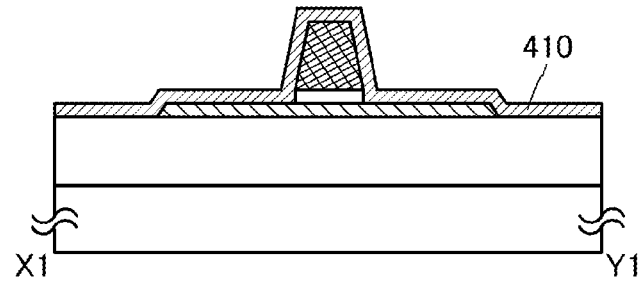
FIGS. 3A to 3D are cross-sectional views showing one example of a method for manufacturing a semiconductor device.
Figure 3B:
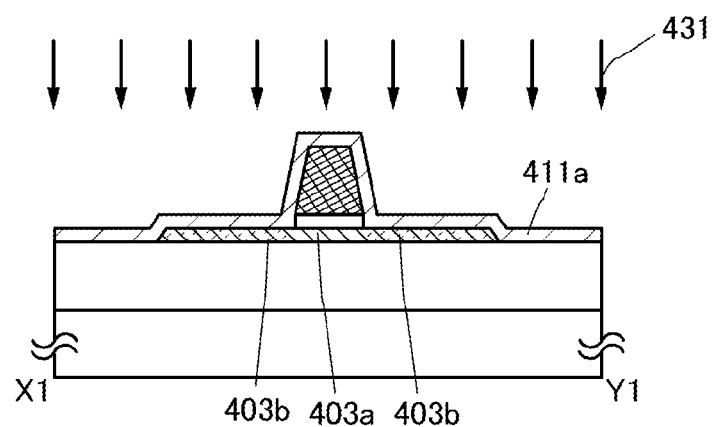

Next, a metal film 410 is formed to cover the oxide semiconductor layer 403, the gate insulating layer 402, and the gate electrode layer 401 (see FIG. 3A).

When the metal film 410 is doped with oxygen in a later step, an insulating metal oxide film is formed, which functions as a barrier film in the transistor after being selectively etched. For the insulating metal oxide, a film having a lower oxygen-transmitting property than the gate insulating layer 402 can be used. Further, a film having a high shielding effect (blocking effect) of preventing penetration of both oxygen and impurities such as hydrogen and moisture into the transistor 420 is preferably used. Furthermore, the metal film 410 that is to be an insulating metal oxide film can have a single-layer structure or a stacked-layer structure of an aluminum film, an aluminum film to which magnesium is added, an aluminum film to which titanium is added, a magnesium film, or a titanium film.

The metal film 410 is preferably formed by a sputtering method, an evaporation method, a CVD method, or the like. The metal film 410 preferably has a thickness greater than or equal to 5 nm and less than or equal to 10 nm, further preferably greater than or equal to 5 nm and less than or equal to 7 nm. With the thickness of the metal film 410 being greater than or equal to 5 nm, when the metal film 410 becomes an insulating layer 411 in a later manufacturing step, a sufficient barrier effect can be obtained. Further, with the thickness of the metal film 410 being less than or equal to 10 nm, a pattern of an insulating film 411a can be easily formed in a later manufacturing step.

Next, treatment for introducing oxygen 431 (also referred to as oxygen doping treatment or oxygen implantation treatment) is performed on the metal film 410. In such a manner, the metal film 410 is oxidized to form the insulating film 411a that is an insulating metal oxide film (see FIG. 3B).

Note that the above-described "oxygen doping" means that oxygen (which includes at least one of an oxygen radical, an oxygen atom, an oxygen molecule, an ozone, an oxygen ion (an oxygen molecule ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

As a gas for supplying oxygen, a gas containing O may be used; for example, an $O_2$ gas, an $N_2O$ gas, a $CO_2$ gas, a CO gas, or an $NO_2$ gas may be used. Note that a rare gas (e.g., argon) may be contained in a gas for supplying oxygen.

Here, in the case where the oxide semiconductor layer 403 is the CAAC-OS film, depending on the conditions for the oxygen doping treatment, a crystal structure of the crystalline components may be disordered in a region of the oxide semiconductor layer 403 in contact with the thin metal film 410 due to the introduction of the oxygen 431, whereas a crystal structure of the crystalline components is not damaged in a region of the oxide semiconductor layer 403 overlapping with the gate electrode layer 401 and the gate insulating layer 402. Therefore, in the region in contact with the insulating film 411a in the oxide semiconductor layer 403 after the oxygen doping treatment, the second regions 403b in which the ratio of the crystalline components to the amorphous components is lower than that of the first region 403a in contact with the gate insulating layer 402 may be formed. Alternatively, the crystalline components in the region of the oxide semiconductor layer 403 in contact with the insulating film 411a might be damaged to become amorphous. Further, when the oxide semiconductor layer 403 before the oxygen doping treatment is performed is a film having crystallinity such as a single crystal film or a polycrystalline film, a crystal structure of the crystals in the region in contact with the insulating film 411a is disordered due to the oxygen doping treatment, whereby the crystallinity is lowered and the region of the oxide semiconductor layer 403 in contact with the insulating film 411a can become amorphous in some cases.

In this embodiment, the case where the second regions 403b having a disordered crystal structure (or an amorphized structure) are formed in the oxide semiconductor layer 403 is described as an example. When the crystal structure of the crystalline components included in the second regions 403b is disordered or the second regions 403b becomes amorphous, dangling bonds, distortion between lattices, voids, or oxygen vacancies in the second regions 403b are increased. Note that in the drawing, the case where the second regions 403b are formed entirely in the thickness direction of the oxide semiconductor layer 403 is illustrated; however, this embodiment of the present invention is not limited thereto. For example, the second regions 403b may be formed to only a depth of several nanometers from a surface of the oxide semiconductor layer 403.

The dangling bonds, the distortion between lattices, the voids, or the oxygen vacancies in the second regions 403b can be used as gettering sites of hydrogen. By the heat of heat treatment on the oxide semiconductor layer 403, hydrogen included in the first region 403a of the oxide semiconductor layer 403 moves and the hydrogen is drawn to the second regions 403b.

The heat treatment for gettering hydrogen into the second regions 403b of the oxide semiconductor layer 403 may be performed at a temperature higher than or equal to 100° C. and lower than or equal to the strain point of the substrate, preferably higher than or equal to 200° C. and lower than or equal to 650° C., for example. Through the heat treatment, the hydrogen included in the first region 403a of the oxide semiconductor layer 403 is drawn to the second regions 403b and is gettered by the gettering sites, so that the hydrogen concentration in the first region 403a can be reduced. Further, since the hydrogen gettered in the second regions 403b of the oxide semiconductor layer 403 is stable, the hydrogen is not easily diffused in the first region 403a again. Therefore, the hydrogen concentration in the second regions 403b of the oxide semiconductor layer 403 is increased as compared with that of the first region 403a. By an increase in the hydrogen concentration in the second regions 403b, conductivity of the second regions 403b can be higher than that of the first region 403a. Therefore, the second regions 403b of the oxide semiconductor layer 403 can serve as low-resistance regions.

Note that the heat treatment for gettering hydrogen into the second regions 403b may be performed after a source electrode layer 405a and a drain electrode layer 405b are formed or before and after the source electrode layer 405a and the drain electrode layer 405b are formed. Further, the heat treatment for gettering hydrogen from the first region 403a to the second regions 403b may be performed plural times and may also serve as another heat treatment.

In an oxide semiconductor, part of hydrogen serves as a donor to release electrons as carriers. When the carrier concentration in the channel formation region of the oxide semiconductor layer 403 becomes high, a channel is formed without voltage application to the gate electrode layer 401 and the threshold voltage shifts in the negative direction. Therefore, gettering of the hydrogen included in the first region 403a serving as the channel formation region in the transistor 420 into the second regions 403b is effective to control the threshold voltage of the transistor 420.

In this embodiment, the insulating film 411a and the second regions 403b are formed in the same step; however, this embodiment of the present invention is not limited thereto and a step for forming the second regions 403b may be provided separately. For example, the crystal structure of the crystalline components included in the regions not overlapping with the gate electrode layer 401 and the gate electrode layer 402 may be damaged by addition of a rare gas such as argon. Alternatively, the second regions 403b may be formed by addition of a dopant that is an element by which the conductivity of the oxide semiconductor layer is changed. One or more elements selected from the following can be used as the dopant: Group 15 elements (typical examples thereof are phosphorus (P), arsenic (As), and antimony (Sb)), boron (B), aluminum (Al), tungsten (W), molybdenum (Mo), nitrogen (N), indium (In), gallium (Ga), fluorine (F), chlorine (Cl), titanium (Ti), and zinc (Zn). Further alternatively, the regions may be $N^+$ regions formed by addition of hydrogen.

Alternatively, the heat treatment may be performed after the metal film 410 is formed, whereby a metal element included in the metal film 410, as the dopant, is diffused in a region of the oxide semiconductor layer 403 which is in contact with the metal film 410 to form the second regions 403b.

In the case where the doping step for forming the second regions 403b is provided separately from the step for forming the insulating film 411a, the doping step may be performed at any timing as long as the doping step is performed after the formation of the gate electrode layer 401 and the gate insulating layer 402 and before the formation of the sidewall insulating layer 412. Note that the doping step may be performed plural times. Further, in the case where the doping step for forming the second regions 403b is provided separately from the step for forming the insulating film 411a, the insulating film 411a may be formed by a sputtering method using a metal oxide or metal nitride target without the formation of the metal film 410.

The second regions 403b include more carriers than the first region 403a and are low-resistance regions. Provision of a pair of low-resistance regions with a channel formation region provided therebetween leads to relaxation of an electric field applied to the channel formation region between the pair of low-resistance regions.

Figure 3C:
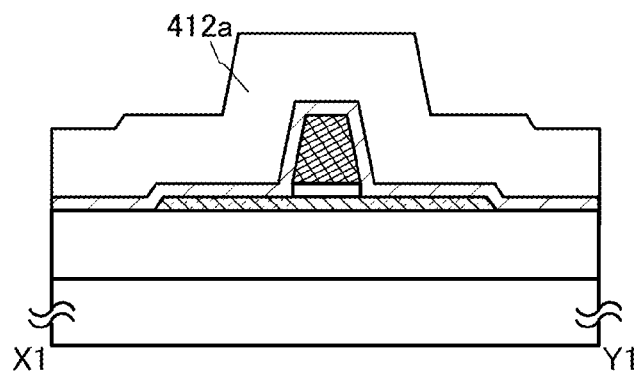

Next, an insulating film 412a is formed over the insulating film 411a (see FIG. 3C).

For the insulating film 412a, for example, silicon oxide, silicon nitride, silicon oxynitride, silicon nitride oxide, or the like can be used. Further, the insulating film 412a is preferably formed by a CVD method such as an LPCVD method or plasma CVD method. In this embodiment, as the insulating film 412a, a silicon oxide film is formed by a plasma CVD method. A plasma CVD method, which enables the insulating film 412a to be formed thick, is advantageous in productivity because attachment or entry of dust or the like into a film at the film formation unlikely occur and the film can be formed at relatively high deposition rate.

Figure 3D:
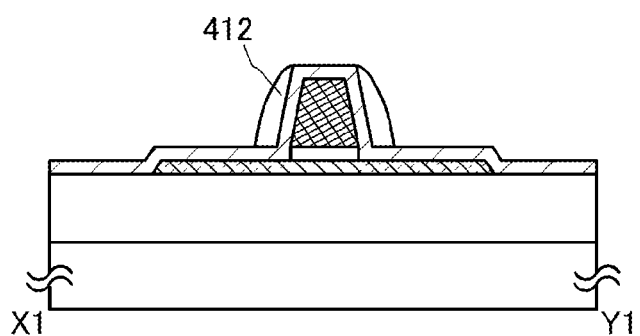

Next, the insulating film 412a is anisotropically etched to form the sidewall insulating layer 412 in a self-aligned manner (see FIG. 3D).

Figure 4A:
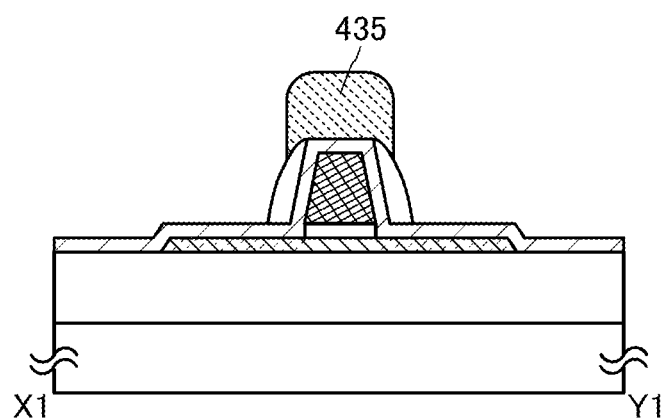
FIGS. 4A to 4C are cross-sectional views showing one example of a method for manufacturing a semiconductor device.

Next, a resist mask 435 is formed over the sidewall insulating layer 412 and the insulating film 411a (see FIG. 4A). The resist mask 435 is formed to overlap with the gate electrode layer 401 and to be in contact with the sidewall insulating layer 412 provided on a side surface of the gate electrode layer 401 with the insulating film 411a provided therebetween. Although the sidewall insulating layer 412 may be completely covered with the resist mask 435 or may be partly contact with the resist mask 435, in cross sections in the channel length direction and the channel width direction, the resist mask 435 is at least provided to be in contact with two surfaces of the sidewall insulating layer 412, which face each other with the gate electrode layer 401 provided between the two surfaces.

Figure 4B:
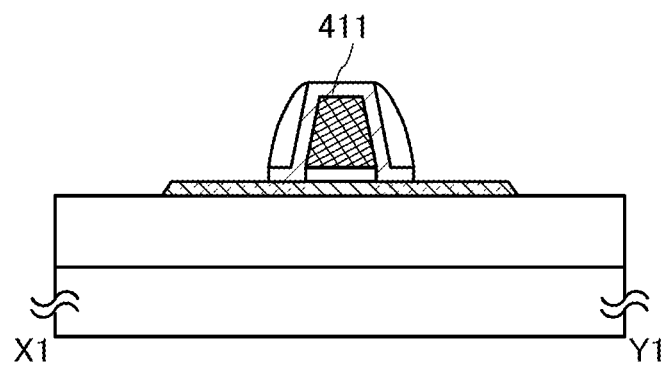

Next, the insulating film 411a is etched using the resist mask 435 and the sidewall insulating layer 412 as masks to form the insulating layer 411 (see FIG. 4B).

Note that in this embodiment, an example in which the insulating film 411a is etched using the sidewall insulating layer 412 as a mask, so that end portions of the sidewall insulating layer 412 are aligned with end portions of the insulating layer 411 is described; however, this embodiment of the present invention is not limited thereto. For example, in the case where the resist mask 435 covers an entire surface of the sidewall insulating layer 412 and is in contact with the insulating film 411a in the region overlapping with the second regions 403b of the oxide semiconductor layer 403, by etching the insulating film 411a using the resist mask 435, the end portions of the insulating layer 411 may extend beyond the end portions of the sidewall insulating layer 412.

The insulating layer 411 covers side surfaces of the gate insulating layer 402 in both the channel length direction and the channel width direction and has a function of preventing elimination of oxygen from the side surfaces of the gate insulating layer 402.

Figure 4C:
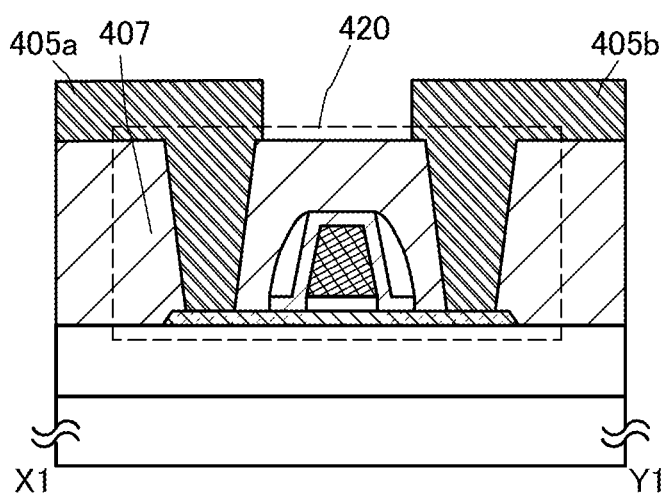

Next, an insulating layer 407 is formed over the oxide semiconductor layer 403, the insulating layer 411, and the sidewall insulating layer 412; openings are formed in the insulating layer 407 and then the source electrode layer 405a and the drain electrode layer 405b which are electrically connected to the oxide semiconductor layer 403 through the openings are formed (see FIG. 4C).

The insulating layer 407 can have a single-layer structure or a stacked-layer structure of an inorganic insulating film such as a silicon oxide film, a silicon oxynitride film, an aluminum oxide film, an aluminum oxynitride film, a gallium oxide film, a hafnium oxide film, a magnesium oxide film, a zirconium oxide film, a lanthanum oxide film, or a barium oxide film, which are formed by a plasma CVD method, a sputtering method, an evaporation method, or the like. Further, as the insulating layer 407, a planarization insulating film may be formed in order to reduce surface roughness due to the transistor or an inorganic insulating film and a planarization insulating film may be stacked. As the planarization insulating film, an organic material such as a polyimide-based resin, an acrylic-based resin, or a benzocyclobutene-based resin can be used. Besides the above organic materials, a low-dielectric constant material (a low-k material) or the like can be used.

As a conductive film used for the source electrode layer 405a and the drain electrode layer 405b, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Further alternatively, the conductive film used for the source electrode layer 405a and the drain electrode layer 405b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For example, as the source electrode layer 405a and the drain electrode layer 405b, a single layer of a molybdenum film, a stack of a tantalum nitride film and a copper film, a stack of a tantalum nitride film and a tungsten film, or the like can be used.

The source electrode layer 405a and the drain electrode layer 405b are in contact with the second regions 403b of the oxide semiconductor layer 403. The structure in which the source electrode layer 405a and the drain electrode layer 405b are in contact with the second regions 403b which are low-resistance regions leads to a reduction in contact resistance between the oxide semiconductor layer 403 and each of the source electrode layer 405a and the drain electrode layer 405b.

Further, a conductive film used for the source electrode layer 405a and the drain electrode layer 405b may be formed by sputtering with high electric power. In this case, part of the oxide semiconductor layer 403, which is exposed in the openings, can become amorphous depending on the conditions for forming the conductive film; therefore, part of the oxide semiconductor film can become selectively amorphous without increasing the number of the steps.

Through the above steps, a semiconductor device having the transistor 420 of this embodiment can be formed.

Figure 15A:
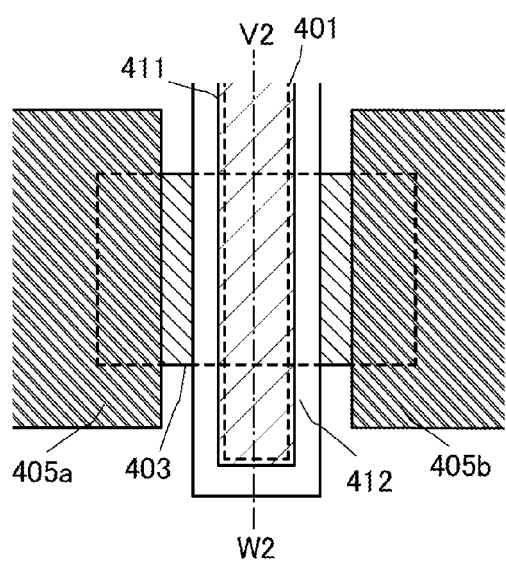
FIGS. 15A and 15B are a plan view and a cross-sectional view illustrating one embodiment of a semiconductor device.
Figure 15B:
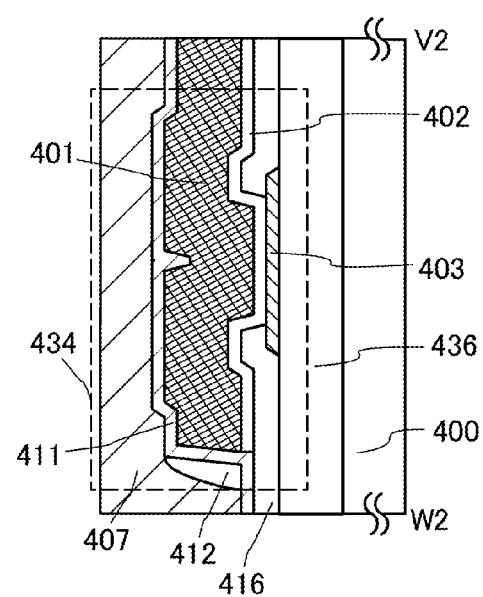

FIGS. 15A and 15B illustrate a variation of the transistor described in this embodiment. FIG. 15A is a plan view of a transistor 434 and FIG. 15B is a cross-sectional view taken along V2-W2 in FIG. 15A. Note that in FIG. 15A, some components of the transistor 434 (e.g., an insulating layer 407, an insulating layer 416) are not illustrated for clarity.

The transistor 434 illustrated in FIGS. 15A and 15B is different from the transistor 420 described above in that at least the end portions of the oxide semiconductor layer 403 in the channel width direction are covered with the insulating layer 416.

In the transistor 434, as the insulating layer 416, a film which includes an oxygen-excess region and has a thickness of approximately 100 nm can be used. Specifically, a silicon oxide film including an oxygen-excess region, a silicon oxynitride film including an oxygen-excess region, or the like can be used. Further, the insulating layer 416 can be formed by a sputtering method or a CVD method; the insulating layer 416 including an oxygen-excess region may be formed through the formation in an oxygen atmosphere or an oxygen-excess region can be formed by an oxygen doping treatment on the insulating layer 416 after the formation of the insulating layer 416.

In the transistor 434, the end portions of the oxide semiconductor layer 403 are covered with the insulating layer 416 including an oxygen-excess region, whereby elimination of oxygen from the side surfaces of the oxide semiconductor layer 403 can be further suppressed and thus the influence of a parasitic channel can be suppressed.

In the transistor 420 and the transistor 434 described in this embodiment, the end portions of the gate insulating layer 402 are covered with the insulating layer 411 having a lower oxygen-transmitting property than the gate insulating layer 402 and a barrier property; therefore, elimination of oxygen from the gate insulating layer 402 and the oxide semiconductor layer 403 can be suppressed. Accordingly, in the transistor 420 and the transistor 434, the influence of a parasitic channel can be suppressed and variation in electric characteristics is suppressed, so that the transistors can be electrically stable. Thus, by using such transistors, a highly reliable semiconductor device can be provided.

The methods and structures described in this embodiment can be combined as appropriate with any of the methods and structures described in the other embodiments.

Embodiment 2

In this embodiment, a semiconductor device having a structure different from that of the semiconductor device in Embodiment 1 will be described with reference to FIGS. 5A and 5B, FIGS. 6A to 6D, and FIGS. 7A to 7D.

Figure 5A:
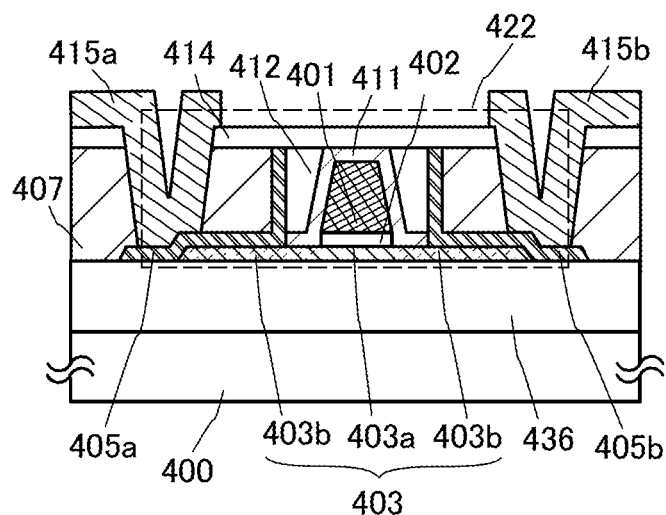
FIGS. 5A and 5B are cross-sectional views each illustrating one embodiment of a semiconductor device.

The transistor 422 illustrated in FIG. 5A, in a manner similar to that of the transistor 420, includes an oxide semiconductor layer 403 provided over a substrate 400; a gate insulating layer 402 provided over the oxide semiconductor layer 403; a gate electrode layer 401 overlapping with the oxide semiconductor layer 403 with the gate insulating layer 402 provided therebetween; an insulating layer 411 being in contact with part of an upper surface of the oxide semiconductor layer 403, covering a side surface of the gate insulating layer 402 and a side surface and an upper surface of the gate electrode layer 401, and having a lower oxygen-transmitting property than the gate insulating layer 402; a sidewall insulating layer 412 provided on the side surface of the gate electrode layer 401 with the insulating layer 411 provided therebetween; and a source electrode layer 405*a* and a drain electrode layer 405*b* which are electrically connected to the oxide semiconductor layer 403.

Further, the transistor 422 may include a base insulating layer 436, an insulating layer 407, an insulating layer 414, or a source wiring layer 415*a* and a drain wiring layer 415*b* as its components. The source wiring layer 415*a* is electrically connected to the source electrode layer 405*a* through an opening provided in the insulating layer 414 and in the insulating layer 407. Further, the drain wiring layer 415*b* is electrically connected to the drain electrode layer 405*b* through an opening provided in the insulating layer 414 and the insulating layer 407.

In the transistor 422, the source electrode layer 405*a* and the drain electrode layer 405*b* are provided to be in contact with a side surface and part of an upper surface of the oxide semiconductor layer 403, a side surface of the insulating layer 411, and a side surface of the sidewall insulating layer 412. In the transistor 422, the whole region (the side surface and the upper surface) of the oxide semiconductor layer 403 is covered with the source electrode layer 405*a* and the drain electrode layer 405*b* which are metal films or the insulating layer 411 which is a barrier film which transmits less oxygen and hydrogen. Therefore, in the oxide semiconductor layer 403 included in the transistor 422, entry of water or hydrogen and elimination of oxygen is suppressed, which leads to an improvement in reliability of the transistor 422.

Figure 5B:
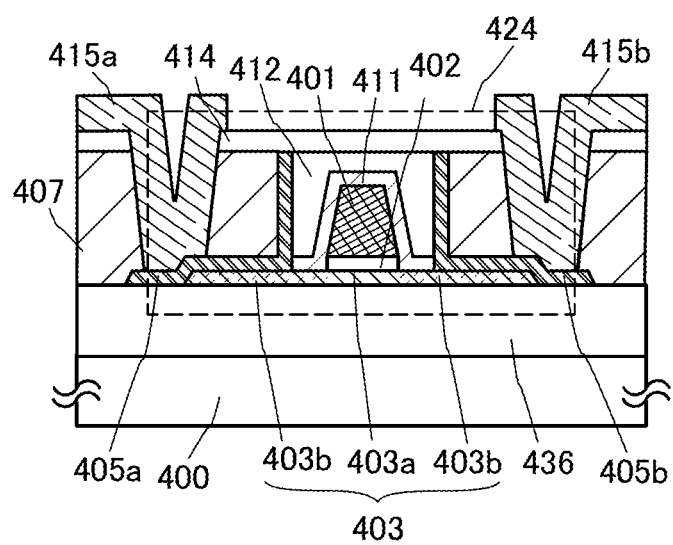

A transistor 424 illustrated in FIG. 5B has a structure similar to that of the transistor 422. A difference between the transistor 422 and the transistor 424 is the shape of the sidewall insulating layer 412. In the transistor 424, the sidewall insulating layer 412 is provided to cover an upper surface of the insulating layer 411.

An example of a method for manufacturing the transistor 422 is described below with reference to FIGS. 6A to 6D.

After the insulating film 412*a* is formed through steps similar to those illustrated in FIGS. 1A to 1C, FIGS. 2A to 2C, and FIGS. 3A to 3D, polishing (cutting or grinding) treatment is performed on the insulating film 412*a* to remove part of the insulating film 412*a* so that an upper surface of the insulating film 411*a* is exposed. By the polishing treatment, a part of the insulating film 412*a* which overlaps the gate electrode layer 401 is removed to form an insulating film 412*b* having an opening. For the polishing (cutting or grinding) treatment, chemical mechanical polishing (CMP) treatment can be preferably used.

Note that the CMP treatment may be performed only once or plural times. When the CMP treatment is performed plural times, first polishing is preferably performed with a high polishing rate followed by final polishing with a low polishing rate. By combining polishing with different polishing rates, planarity of the surfaces of the insulating film 412*b* and the insulating film 411*a* can be improved.

Note that in the case where the polishing treatment is performed until the insulating film 412*a* is flat without exposing the insulating film 411*a*, through a manufacturing process similar to that of the transistor 422 after the polishing treatment, the transistor 424 can be formed.

Figure 6A:
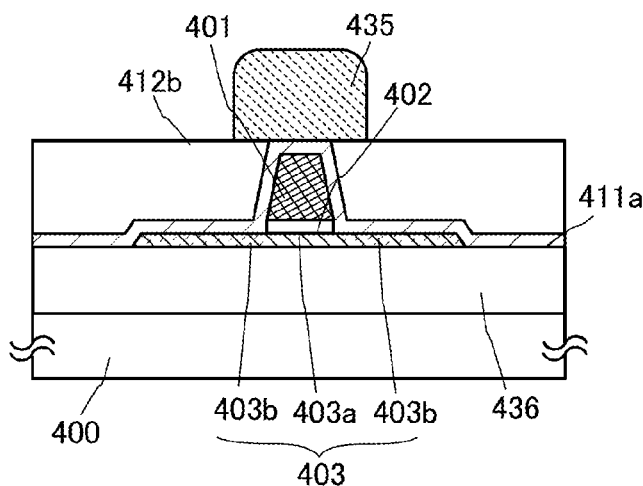
FIGS. 6A to 6D are cross-sectional views showing one example of a method for manufacturing a semiconductor device.

A resist mask 435 is formed over the insulating film 411*a* and the insulating film 412*b* (see FIG. 6A).

Figure 6B:
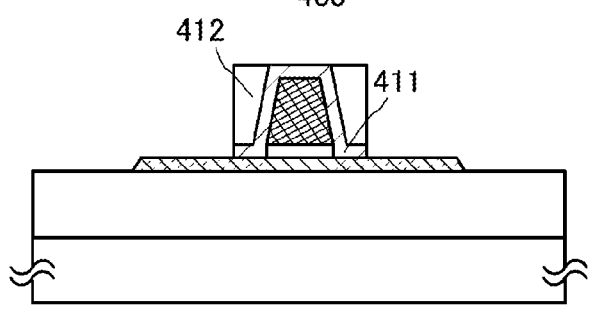
Figure 6C:
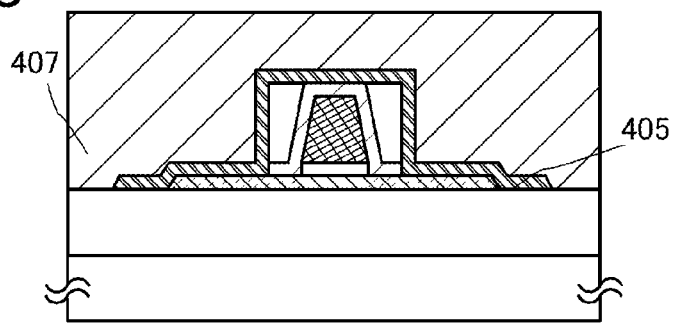
Figure 6D:
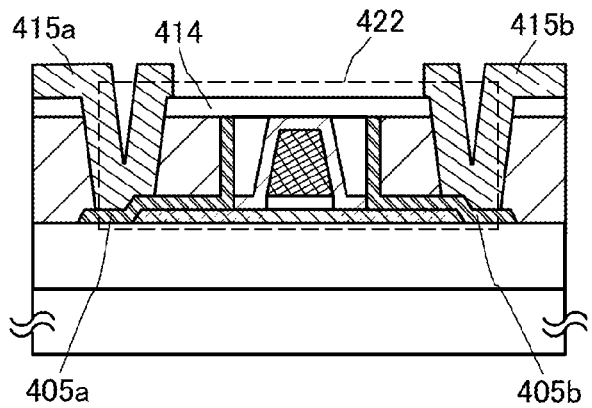

With the resist mask 435, the insulating film 411*a* and the insulating film 412*b* are etched to form the insulating film 411 and the sidewall insulating layer 412 (see FIG. 6B).

Next, a conductive film is formed to cover the oxide semiconductor layer 403, the insulating film 411, and the sidewall insulating layer 412; the conductive film is selectively etched using a resist mask formed through a photolithography process to form a conductive film 405. The conductive film 405 has a region overlapping with the insulating film 411. After that, the insulating layer 407 is formed over the conductive film 405 (see FIG. 6C).

For the conductive film 405, a material similar to those of the source electrode layer 405*a* and the drain electrode layer 405*b* described in Embodiment 1 can be used.

Next, polishing (cutting or grinding) treatment is performed on the insulating layer 407 and the conductive film 405, and a part of the conductive film 405 which is the region overlapping with the insulating film 411 is removed to form the source electrode layer 405*a* and the drain electrode layer 405*b*. By the removal of a part of the conductive film 405 which is the region overlapping with the insulating film 411 through the polishing treatment, the conductive film 405 can be divided along the channel length direction without using a resist mask; therefore, even when a transistor has a short channel length, the source electrode layer 405a and the drain electrode layer 405b can be formed with high accuracy.

After that, the insulating layer 414 is formed over the insulating layer 407 and openings that reach the oxide semiconductor layer 403 are formed in the insulating layer 414 and the insulating layer 407. The source wiring layer 415a which is electrically connected to the source electrode layer 405a and the drain wiring layer 415b which is electrically connected to the drain electrode layer 405b are formed in the openings (see FIG. 6D).

Further, in formation of a conductive film used for the source wiring layer 415a and the drain wiring layer 415b, the conductive film may be formed by sputtering with high electric power. In this case, part of the oxide semiconductor layer 403, which is exposed in the openings, can become amorphous depending on the conditions for forming the conductive film; therefore, part of the oxide semiconductor film can become amorphous without increasing the number of the steps.

Through the above steps, a semiconductor device having the transistor 422 of this embodiment can be manufactured.

Figure 7A:
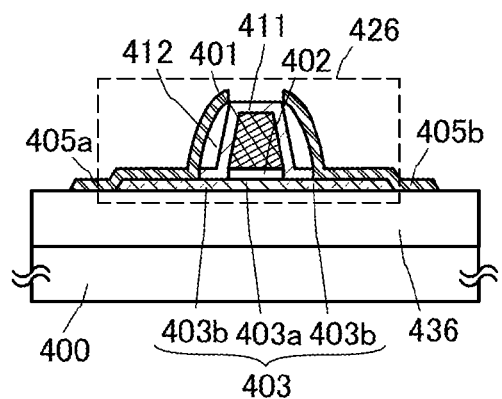
FIGS. 7A to 7D are cross-sectional views each illustrating one embodiment of a semiconductor device.
Figure 7B:
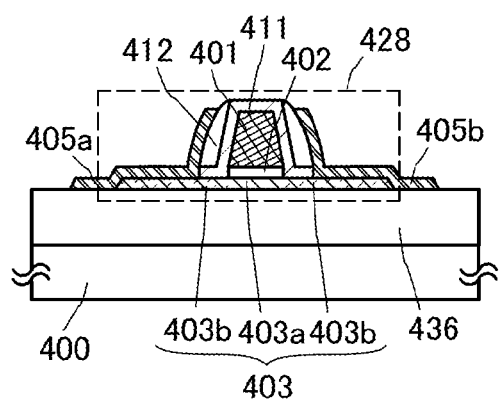
Figure 7C:
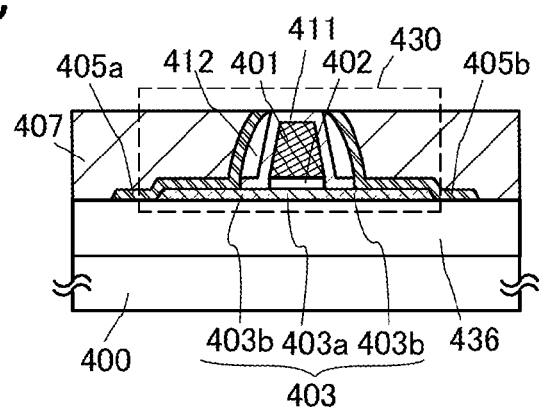
Figure 7D:
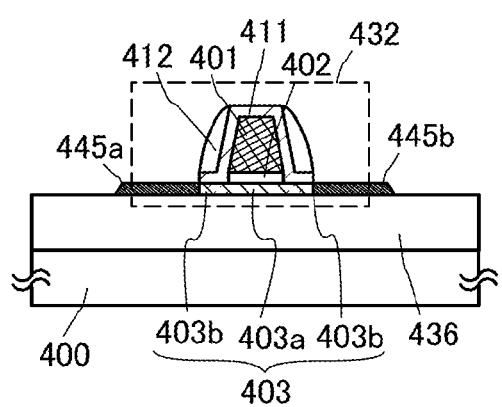

FIGS. 7A and 7D illustrate a variation of the transistor of this embodiment.

A transistor 426 illustrated in FIG. 7A is an example in which after the step shown in FIG. 4B, a conductive film which is to be the source electrode layer 405a and the drain electrode layer 405b is formed over the oxide semiconductor layer 403, the insulating film 411, and the sidewall insulating layer 412, and the conductive film is etched using a resist mask formed through a photolithography process, whereby the source electrode layer 405a and the drain electrode layer 405b are formed.

A transistor 428 illustrated in FIG. 7B, in a manner similar to that of the transistor 426, is an example in which after the step shown in FIG. 4B, a conductive film which is to be the source electrode layer 405a and the drain electrode layer 405b is formed over the oxide semiconductor layer 403, the insulating film 411, and the sidewall insulating layer 412, and the conductive film is made to recede by etching using a resist mask formed through a photolithography process, whereby the source electrode layer 405a and the drain electrode layer 405b are formed.

A transistor 430 illustrated in FIG. 7C is formed in the following manner, for example: in a manner similar to that of the transistor 426, after the step shown in FIG. 4B, a conductive film which is to be the source electrode layer 405a and the drain electrode layer 405b is formed over the oxide semiconductor layer 403, the insulating film 411, and the sidewall insulating layer 412, and the conductive film is selectively etched using a resist mask formed through a photolithography process. After that, the insulating layer 407 is formed over the conductive film which is selectively etched and polishing (cutting or grinding) treatment is performed on the insulating layer 407 and the conductive film; thus a part of the conductive film which is a region overlapping with the gate electrode layer 401 is removed to form the source electrode layer 405a and the drain electrode layer 405b. By the removal of a part of the conductive film which is the region overlapping with the gate electrode layer 401 through the polishing treatment, the conductive film can be divided in the channel length direction without using a resist mask; therefore, even when a transistor has a short channel length, the source electrode layer 405a and the drain electrode layer 405b can be formed with high accuracy.

A transistor 432 illustrated in FIG. 7D is an example in which the source electrode layer 405a and the drain electrode layer 405b are provided in regions not overlapping with the gate insulating layer 402. The transistor 432 is formed in the following manner, for example: after the step shown in FIG. 4B, a metal film (an aluminum film, a titanium film, or the like) is formed over the oxide semiconductor layer 403, the insulating film 411, and the sidewall insulating layer 412 by sputtering with high electric power and thus a region of the oxide semiconductor layer 403 which is in contact with the metal film is made amorphous; through heat treatment, a metal element is diffused in the oxide semiconductor layer 403, whereby the resistance of the oxide semiconductor layer 403 is reduced, so that an amorphous region 445a serving as a source electrode layer and an amorphous region 445b serving as a drain electrode layer are formed. Note that after the amorphous region 445a and the amorphous region 445b are formed, the metal film is removed.

In the transistor described in this embodiment, the distance between a region where the source electrode layer 405a and the oxide semiconductor layer 403 are in contact with each other (source side contact region) and the gate electrode layer 401 and the distance between a region where the drain electrode layer 405b and the oxide semiconductor layer 403 are in contact with each other (drain side contact region) and the gate electrode layer 401 can be reduced. Therefore, the resistance between the source side contact region or the drain side contact region and the gate electrode layer 401 can be reduced, so that the on-state characteristics can be improved.

In the transistor described in this embodiment, the sidewall insulating layer 412 has a function of suppressing formation of a parasitic channel between the source electrode layer 405a or the drain electrode layer 405b and the gate electrode layer 401.

Further, in the transistor described in this embodiment, in a manner similar to that of the transistor described in Embodiment 1, the end portions of the gate insulating layer 402 are covered with the insulating layer 411 having a barrier property against oxygen, preferably a barrier property against oxygen and hydrogen; therefore, elimination of oxygen from the gate insulating layer 402 and the oxide semiconductor layer 403 and entry of hydrogen into the gate insulating layer 402 and the oxide semiconductor layer 403 can be suppressed. Thus, the oxide semiconductor layer 403 can be highly purified and become an i-type (intrinsic) semiconductor. Variation in electric characteristics of a transistor having the highly-purified and i-type (intrinsic) oxide semiconductor is suppressed, and the transistor is electrically stable.

The methods and structures described in this embodiment can be combined as appropriate with any of the methods and structures described in the other embodiments.

Embodiment 3

In this embodiment, an example of a semiconductor device (memory device) which includes the transistor described in this specification, which can hold stored data even when not powered, and which has an unlimited number of write cycles will be described with reference to drawings.

Figure 8A:
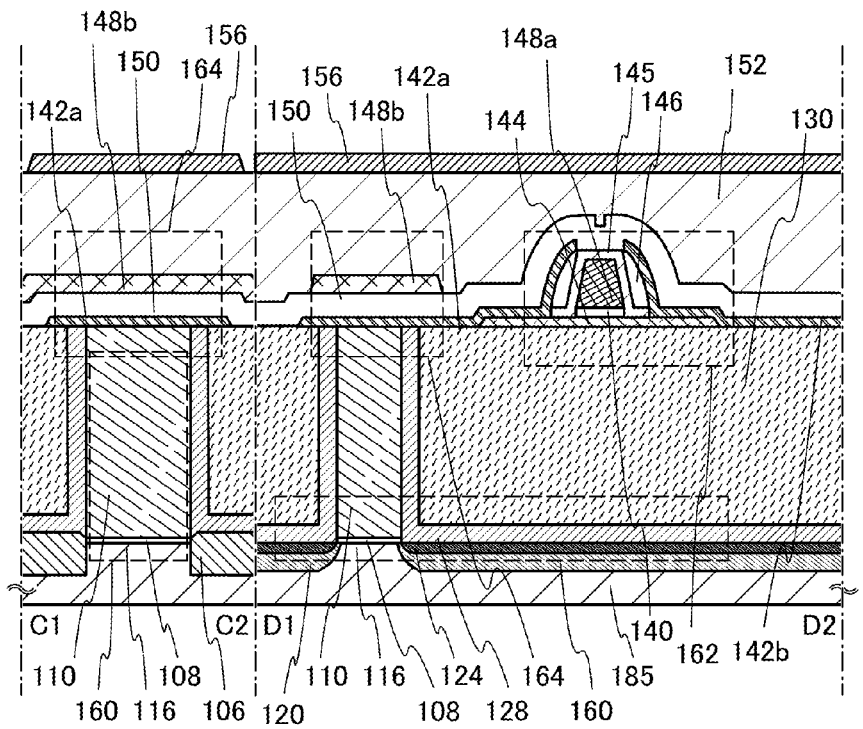
FIGS. 8A to 8C are a plane view, a cross-sectional view, and a circuit diagram illustrating one embodiment of a semiconductor device.
Figure 8B:
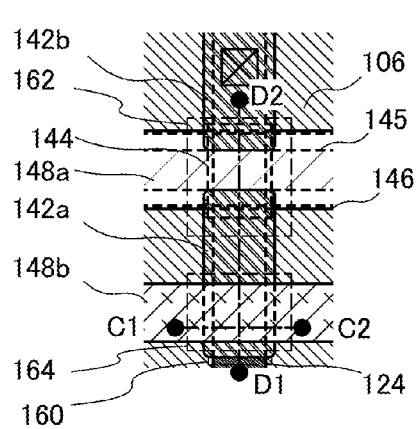
Figure 8C:
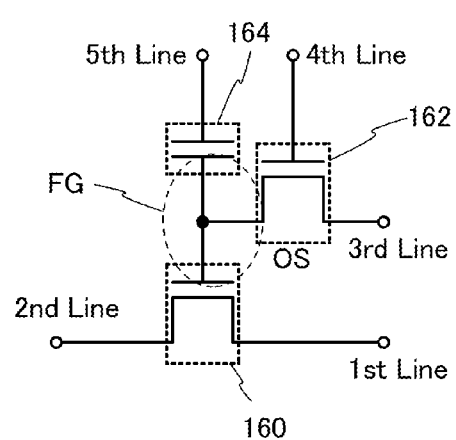

FIGS. 8A to 8C illustrate an example of a structure of a semiconductor device. FIG. 8A is a cross-sectional view of the semiconductor device, FIG. 8B is a plane view of the semiconductor device, and FIG. 8C is a circuit diagram of the semiconductor device. Here, FIG. 8A corresponds to a cross section along line C1-C2 and line D1-D2 in FIG. 8B.

The semiconductor device illustrated in FIGS. 8A and 8B includes a transistor 160 including a first semiconductor material in a lower portion, and the transistor 162 including a second semiconductor material in an upper portion. The transistor 162 applies the structure of the transistor 426 shown in Embodiment 2 as an example.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. The specific structure of the semiconductor device, such as the material used for the semiconductor device and the structure of the semiconductor device, is not necessarily limited to those described here except for the use of the transistor described in Embodiment 1 or 2, which is formed using an oxide semiconductor for holding data.

The transistor 160 in FIG. 8A includes a channel formation region 116 provided in a substrate 185 containing a semiconductor material (e.g., silicon), impurity regions 120 provided so that the channel formation region 116 is sandwiched therebetween, intermetallic compound regions 124 in contact with the impurity regions 120, a gate insulating layer 108 provided over the channel formation region 116, and a gate electrode layer 110 provided over the gate insulating layer 108. Note that a transistor whose source electrode layer and drain electrode layer are not illustrated in a drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 106 is formed over the substrate 185 to surround the transistor 160, and an insulating layer 128 and an insulating layer 130 are formed to surround the transistor 160.

The transistor 160 formed using a single crystal semiconductor substrate can operate at high speed. Thus, when the transistor is used as a reading transistor, data can be read at a high speed. As treatment prior to formation of the transistor 162 and a capacitor 164, CMP treatment is performed on the insulating layer covering the transistor 160, whereby the insulating layers 128 and 130 are planarized and, at the same time, an upper surface of the gate electrode layer of the transistor 160 is exposed.

The transistor 162 in FIG. 8A includes an oxide semiconductor in the channel formation region and is a top-gate transistor. Here, the end portions of the gate insulating layer 140 included in the transistor 162 are covered with the insulating layer 145 having a barrier property against oxygen and hydrogen. Therefore, elimination of oxygen from the gate insulating layer 140 and the oxide semiconductor layer 144 and entry of hydrogen into the gate insulating layer 140 and the oxide semiconductor layer 144 can be suppressed; thus, the oxide semiconductor layer 144 can be highly purified and become an i-type (intrinsic) semiconductor. The transistor 162 having the highly purified and i-type (intrinsic) oxide semiconductor has extremely favorable off-state characteristics. Further, in the transistor 162 described in this embodiment, a sidewall insulating layer 146 can suppress formation of a parasitic channel between an electrode layer 142a or an electrode layer 142b and a gate electrode layer 148a.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

An insulating layer 150 having a single-layer structure or a stacked-layer structure is provided over the transistor 162. In addition, a conductive layer 148b is provided in a region overlapping with the electrode layer 142a of the transistor 162 with the insulating layer 150 interposed therebetween, and the electrode layer 142a, the insulating layer 150, and the conductive layer 148b form a capacitor 164. That is, the electrode layer 142a of the transistor 162 functions as one electrode of the capacitor 164, and the conductive layer 148b functions as the other electrode of the capacitor 164. Note that the capacitor 164 may be omitted if a capacitor is not needed. Alternatively, the capacitor 164 may be separately provided above the transistor 162.

The insulating layer 152 is provided over the transistor 162 and the capacitor 164. Further, a wiring 156 is provided over the insulating layer 152. The wiring 156 is a wiring for connecting the transistor 162 to another transistor. Although not illustrated in FIG. 8A, the wiring 156 is electrically connected to the electrode layer 142b through an electrode layer formed in an opening provided in the insulating layer 150, the insulating layer 152, or the like.

In FIGS. 8A and 8B, the transistor 160 and the transistor 162 are overlapped with each other at least partly; it is preferable that a source region or a drain region of the transistor 160 overlap with part of the oxide semiconductor layer 144. Further, the transistor 162 and the capacitor 164 are provided so as to overlap with at least part of the transistor 160. For example, the conductive layer 148b of the capacitor 164 is provided to at least partly overlap with the gate electrode layer 110 of the transistor 160. With such a planar layout, the area occupied by the semiconductor device can be reduced; thus, higher integration can be achieved.

Next, an example of a circuit configuration corresponding to FIGS. 8A and 8B is illustrated in FIG. 8C.

In FIG. 8C, a first line (1st Line) is electrically connected to a source electrode layer of the transistor 160. A second line (2nd Line) is electrically connected to a drain electrode layer of the transistor 160. A third line (3rd Line) is electrically connected to one of a source electrode layer and a drain electrode layer of the transistor 162, and a fourth line (4th Line) is electrically connected to a gate electrode layer of the transistor 162. A gate electrode layer of the transistor 160 and one of the source electrode layer and the drain electrode layer of the transistor 162 are electrically connected to one electrode of the capacitor 164. A fifth line (5th Line) and the other electrode of the capacitor 164 are electrically connected to each other.

The semiconductor device shown in FIG. 8C utilizes a characteristic in which the potential of the gate electrode layer of the transistor 160 can be held, and can thus write, hold, and read data as follows.

Writing and holding of data will be described. First, the potential of the fourth line is set to a potential at which the transistor 162 is turned on, so that the transistor 162 is turned on. Accordingly, the potential of the third line is supplied to the gate electrode layer of the transistor 160 and to the capacitor 164. That is, predetermined charge is supplied to the gate electrode layer of the transistor 160 (writing). Here, one of two kinds of charges providing different potentials (hereinafter referred to as a low-level charge and a high-level charge) is given. After that, the potential of the fourth line is set to a potential at which the transistor 162 is turned off, so that the transistor 162 is turned off. Thus, the charge given to the gate electrode layer of the transistor 160 is held (storing).

Since the off-state current of the transistor 162 is extremely small, the charge of the gate electrode layer of the transistor 160 is held for a long time.

Next, reading data is described. By supplying an appropriate potential (a reading potential) to the fifth line while a predetermined potential (a constant potential) is supplied to the first line, the potential of the second line varies depending on the amount of charge held in the gate electrode layer of the transistor 160. This is because in general, when the transistor 160 is an n-channel transistor, an apparent threshold voltage $V_{th\_H}$ in the case where the high-level charge is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth line, which is needed to turn on the transistor 160. Thus, the potential of the fifth line is set to a potential $V_0$ which is between $V_{th\_H}$ and $V_{th\_L}$, whereby charge supplied to the gate electrode of the transistor 160 can be determined. For example, in the case where a high-level charge is given in writing, when the potential of the fifth line is set to $V_0$ ($>V_{th\_H}$), the transistor 160 is turned on. In the case where a low-level charge is given in writing, even when the potential of the fifth line is set to $V_0$ ($<V_{th\_L}$), the transistor 160 remains in an off state. Therefore, the data held can be read by the potential of the second line.

Note that in the case where memory cells are arrayed to be used, only data of desired memory cells needs to be read. In the case where such reading is not performed, a potential at which the transistor 160 is turned off regardless of the state of the gate electrode layer of the transistor 160, that is, a potential smaller than $V_{th\_H}$ may be given to the fifth line. Alternatively, a potential at which the transistor 160 is turned on regardless of the state of the gate electrode layer, that is, a potential higher than $V_{th\_L}$ may be given to the fifth line.

When a transistor having a channel formation region formed using an oxide semiconductor and having extremely small off-state current is applied to the semiconductor device in this embodiment, the semiconductor device can hold stored data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided.

The methods and structures described in this embodiment can be combined as appropriate with any of the methods and structures described in the other embodiments.

Embodiment 4

In this embodiment, one embodiment of a structure of a memory device which is different from that in Embodiment 3 will be described.

Figure 9:
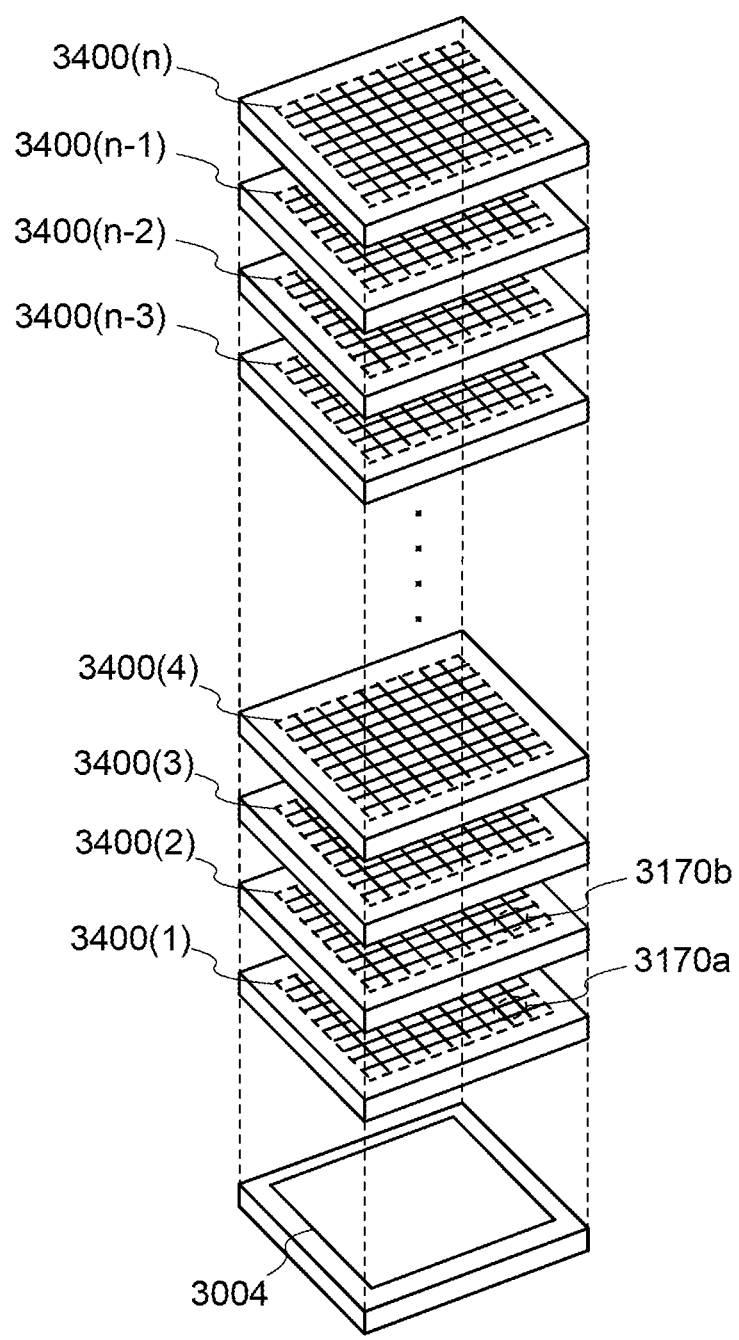
FIG. 9 is a perspective view illustrating one embodiment of a semiconductor device.

FIG. 9 is a perspective view of a memory device. The memory device illustrated in FIG. 9 includes a plurality of layers of memory cell arrays (memory cell arrays 3400(1) to 3400(*n*) (*n* is an integer greater than or equal to 2)) each including a plurality of memory cells as memory circuits in the upper portion, and a logic circuit 3004 in the lower portion which is necessary for operating the memory cell arrays 3400(1) to 3400(*n*).

FIG. 9 illustrates the logic circuit 3004, the memory cell array 3400(1), and the memory cell array 3400(2), and illustrates a memory cell 3170*a* and a memory cell 3170*b* as typical examples among the plurality of memory cells included in the memory cell array 3400(1) and the memory cell array 3400(2). The memory cell 3170*a* and the memory cell 3170*b* can have a configuration similar to the circuit configuration described in the above embodiment, for example.

Figure 10:
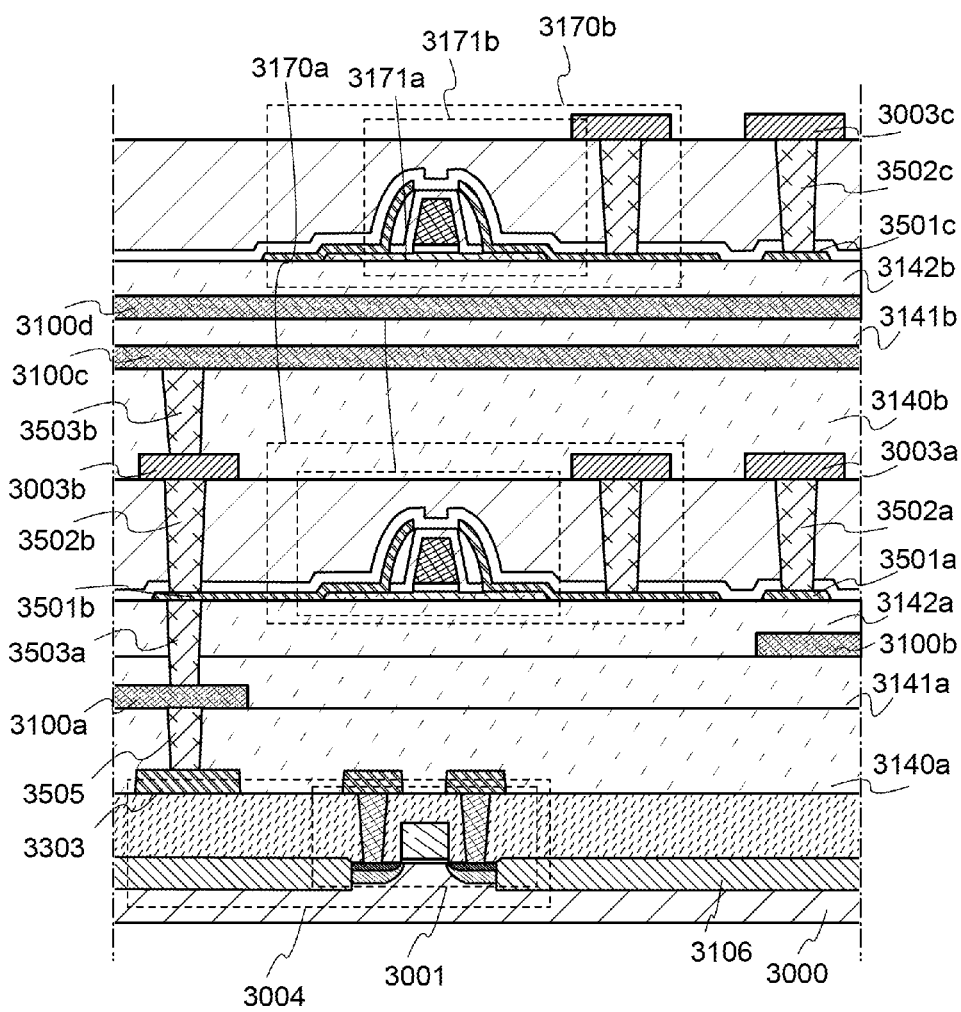
FIG. 10 is a cross-sectional view illustrating one embodiment of a semiconductor device.

Note that a transistor 3171*a* included in the memory cell 3170*a* is illustrated in FIG. 10 as a typical example. Further, a transistor 3171*b* included in the memory cell 3170*b* is illustrated as a typical example. In the transistor 3171*a* and the transistor 3171*b*, a channel formation region is formed in an oxide semiconductor layer. The structure of the transistor in which the channel formation region is formed in the oxide semiconductor layer is the same as the structure described in Embodiment 1 or 2, and thus the description of the structure is omitted.

An electrode layer 3501*a* that is formed in the same layer as a source electrode layer and a drain electrode layer of the transistor 3171*a* is electrically connected to an electrode layer 3003*a* through an electrode layer 3502*a*. An electrode 3501*c* that is formed in the same layer as a source electrode layer and a drain electrode layer of the transistor 3171*b* is electrically connected to an electrode layer 3003*c* through an electrode layer 3502*c*.

The logic circuit 3004 includes a transistor 3001 in which a semiconductor material except an oxide semiconductor is used as a channel formation region. The transistor 3001 can be a transistor obtained in such a manner that an element isolation insulating layer 3106 is provided over a substrate 3000 including a semiconductor material (e.g., silicon) and a region serving as the channel formation region is formed in a region surrounded by the element isolation insulating layer 3106. Note that the transistor 3001 may be a transistor obtained in such a manner that the channel formation region is formed in a semiconductor film such as a polycrystalline silicon film formed on an insulating surface or in a silicon film of an SOI substrate. Description of the transistor 3001 is omitted because a known structure can be used.

A wiring 3100a and a wiring 3100b are formed between layers in which the transistor 3171a is formed and layers in which the transistor 3001 is formed. An insulating layer 3140a is provided between the wiring 3100a and the layer in which the transistor 3001 is formed, an insulating layer 3141a is provided between the wiring 3100a and the wiring 3100b, and an insulating layer 3142a is provided between the wiring 3100b and the layer in which the transistor 3171a is formed.

Similarly, a wiring 3100c and a wiring 3100d are formed between the layers in which the transistor 3171b is formed and the layers in which the transistor 3171a is formed. An insulating layer 3140b is provided between the wiring 3100c and the layers in which the transistor 3171a is formed. An insulating layer 3141b is provided between the wiring 3100c and the wiring 3100d. An insulating layer 3142b is provided between the wiring 3100d and the layers in which the transistor 3171b is formed.

The insulating layer 3140a, the insulating layer 3141a, the insulating layer 3142a, the insulating layer 3140b, the insulating layer 3141b, and the insulating layer 3142b function as interlayer insulating layers, and their surfaces are planarized.

The wirings 3100a, 3100b, 3100c, and 3100d enable electrical connection between the memory cells, electrical connection between the logic circuit 3004 and the memory cells, and the like.

An electrode layer 3303 included in the logic circuit 3004 can be electrically connected to a circuit provided in the upper portion.

For example, as illustrated in FIG. 10, the electrode layer 3303 can be electrically connected to the wiring 3100a through an electrode layer 3505. The wiring 3100a can be electrically connected to an electrode layer 3501b of the transistor 3171a through an electrode layer 3503a. In this manner, the wiring 3100a and the electrode layer 3303 can be electrically connected to the source or the drain of the transistor 3171a. The electrode layer 3501b serving as the source or the drain of the transistor 3171a can be electrically connected to an electrode layer 3003b through an electrode layer 3502b. The electrode layer 3003b can be electrically connected to the wiring 3100c through an electrode layer 3503b.

FIG. 10 illustrates an example in which the electrode layer 3303 and the transistor 3171a are electrically connected to each other through the wiring 3100a; however, one embodiment of the disclosed invention is not limited thereto. The electrode layer 3303 may be electrically connected to the transistor 3171a through either the wiring 3100b or the wiring 3100a and the wiring 3100b or through another layer electrode layer without using the wiring 3100a or the wiring 3100b.

FIG. 10 illustrates the structure where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the number of wiring layers provided therebetween is not limited to two. One wiring layer or three or more wiring layers may be provided between the layers in which the transistor 3171a is formed and the layers in which the transistor 3001 is formed.

FIG. 10 illustrates the structure where two wiring layers, i.e., a wiring layer in which the wiring 3100c is formed and a wiring layer in which the wiring 3100d is formed are provided between the layers in which the transistor 3171b is formed and the layers in which the transistor 3171a is formed; however, the number of wiring layers provided therebetween is not limited to two. One wiring layer or three or more wiring layers may be provided between the layers in which the transistor 3171b is formed and the layers in which the transistor 3171a is formed.

The methods and structures described in this embodiment can be combined as appropriate with any of the methods and structures described in the other embodiments.

Embodiment 5

In this embodiment, a central processing unit (CPU) at least part of which includes the transistor disclosed in Embodiment 1 or 2 will be described as an example of a semiconductor device.

Figure 11A:
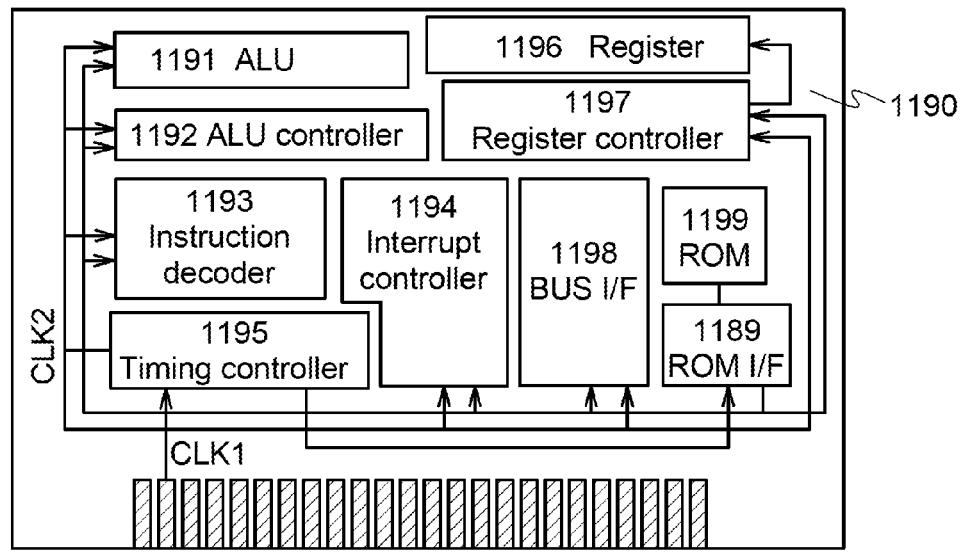
FIGS. 11A to 11C are a block diagram illustrating one embodiment of a semiconductor device and partial diagrams of the block diagram.

FIG. 11A is a block diagram illustrating a specific structure of a CPU. The CPU illustrated in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 11A is only an example in which the configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 11A, a memory cell is provided in the register 1196. As the memory cell of the register 1196, the memory cell described in Embodiment 3 or 4 can be used.

In the CPU illustrated in FIG. 11A, the register controller 1197 selects operation of holding data in the register 1196 in accordance with an instruction from the ALU 1191. That is, the register controller 1197 selects whether data is held by a logic element which inverts a logical value or a capacitor in the memory cell included in the register 1196. When data holding by the logic element which inverts a logical value is selected, power supply voltage is supplied to the memory cell in the register 1196. When data holding by the capacitor is selected, the data is rewritten in the capacitor, and supply of power supply voltage to the memory cell in the register 1196 can be stopped.

Figure 11B:
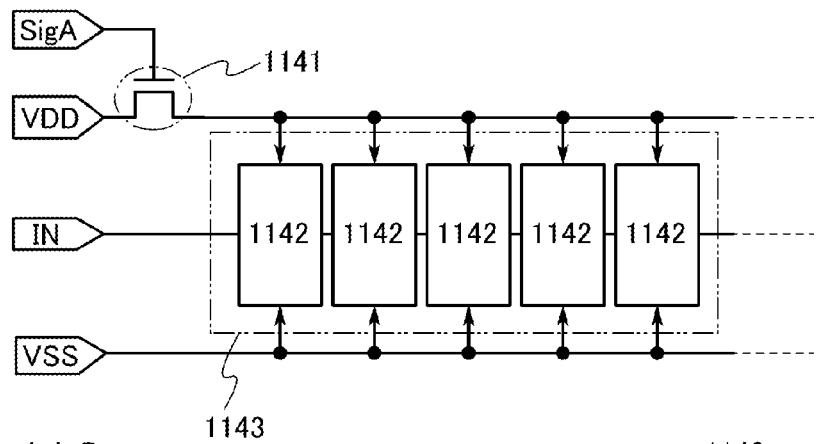
Figure 11C:
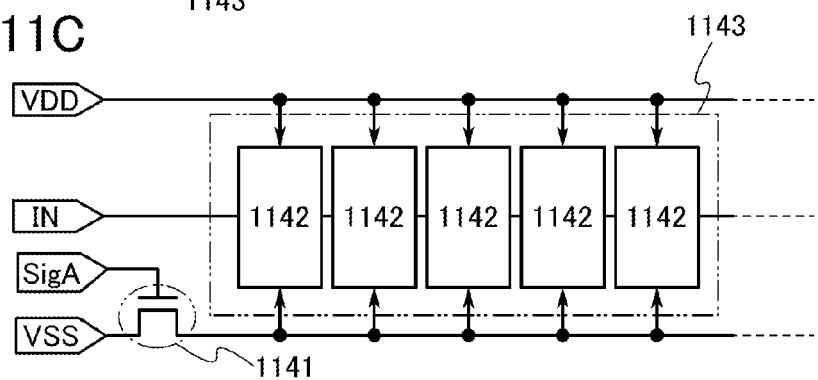

The power supply can be stopped by providing a switching element between a memory cell group and a node to which a power supply potential VDD or a power supply potential VSS is supplied, as illustrated in FIG. 11B or FIG. 11C. Circuits illustrated in FIGS. 11B and 11C are described below.

FIGS. 11B and 11C each illustrate an example of a structure of a memory circuit in which the transistor disclosed in Embodiment 1 or 2 is used as a switching element for controlling supply of a power supply potential to a memory cell.

The memory device illustrated in FIG. 11B includes a switching element 1141 and a memory cell group 1143 including a plurality of memory cells 1142. Specifically, as each of the memory cells 1142, the memory cell described in Embodiment 3 or 4 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 11B, the transistor described in Embodiment 1 or 2 is used as the switching element 1141, and the switching of the transistor is controlled by a signal SigA supplied to a gate electrode layer thereof.

Note that FIG. 11B illustrates the configuration in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 11B, the switching element 1141 may control the supply of the low-level power supply potential VSS.

In FIG. 11C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The methods and structures described in this embodiment can be combined as appropriate with any of the methods and structures described in the other embodiments.

Further, Table 1 shows a comparison between a spin-MRAM (spin-transfer torque MRAM) which is known as a spintronics device and a memory including an oxide semiconductor.

TABLE 1

|  | Spintronics (magnetic) | Oxide semiconductor/Si |
|---|---|---|
| 1) Heat resistance | Unstable | Extremely stable (up to 150° C.) |
| 2) Driving method | Current drive | Voltage drive |
| 3) Principle of writing operation | Change Spin Direction of Magnetic Substance | On/Off of FET |
| 4) Si LSI | Suitable for bipolar LSI (MOS transistor is preferred in high integration circuit (Bipolar transistor is unsuitable for High Integration), W is large) | Suitable for MOS LSI |
| 5) Power for Overhead | High Joule heat is needed | Charge and discharge of parasitic capacitance Smaller than in spintronics by 2 or 3 or more orders of magnitude |
| 6) Non-volatility | Utilizing Spin | Utilizing small off-state current |
| 7) Number of times of reading operation | Unlimited | Unlimited |
| 8) 3D conversion | Difficult (2 layers at most) | Easy (No limitation on the number of layers) |
| 9) Degree of integration ($F^2$) | $15F^2$ | Depending on the degree of 3D conversion |
| 10) Material | Magnetic rare earth (strategic material) | Oxide semiconductor material |
| 11) Resistance to magnetic field | Low | High |

As shown in Table 1, the memory in which a transistor including an oxide semiconductor and a transistor including silicon are combined is significantly different from the spintronics device in the driving method, the principle of writing operation, the material, and the like.

Further, as shown in Table 1, the memory in which the transistor including an oxide semiconductor and the transistor including silicon are combined has advantages over the spintronics device in many aspects such as the heat resistance, the 3D conversion (stacked-layer structure of three or more layers), and the resistance to a magnetic field. Note that the power for overhead shown in Table 1 is, for example, power for writing data into a memory portion or the like in a processor, which is what is called power consumed for overhead.

As described above, the use of the memory including an oxide semiconductor, which has more advantages than the spintronics device makes it possible to reduce power consumption of a CPU.

The methods and structures described in this embodiment can be combined as appropriate with any of the methods and structures described in the other embodiments.

Embodiment 6

A semiconductor device disclosed in this specification can be applied to a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are shown in FIGS. 12A to 12C.

Figure 12A:
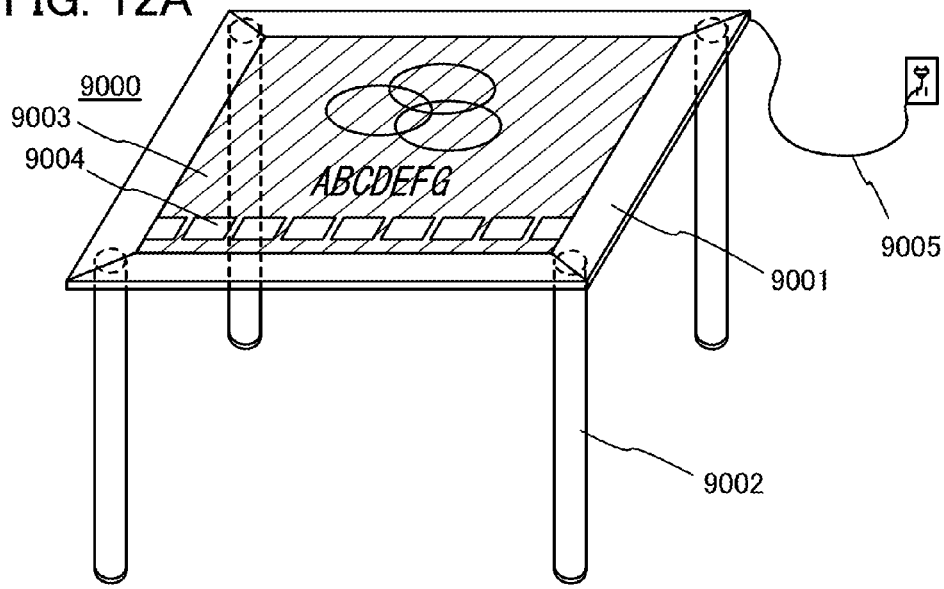
FIGS. 12A to 12C each illustrate an electronic device.
Figure 12B:
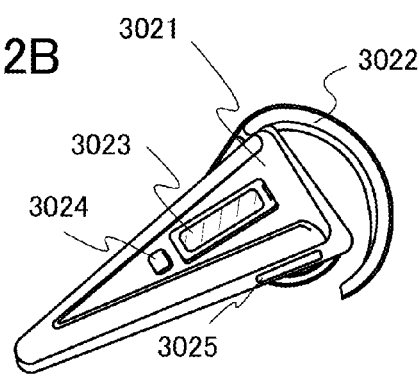
Figure 12C:
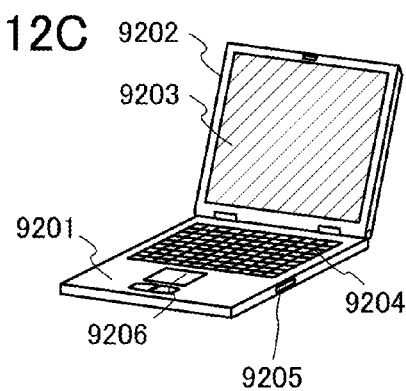

FIG. 12A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in Embodiment 1 or 2 can be used for the display portion 9003 so that the electronic devices can have a high reliability The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 12B illustrates a portable music player, which includes, in a main body 3021, a display portion 3023, a fixing portion 3022 with which the main body is worn on the ear, a speaker, an operation button 3024, an external memory slot 3025, and the like. When the transistor described in Embodiment 1 or 2 or the memory described in Embodiment 3 or 4 is used in a memory or a CPU incorporated in the main body 3021, power consumption of the portable music player (PDA) can be further reduced.

Furthermore, when the portable music player illustrated in FIG. 12B has an antenna, a microphone function, or a wireless communication function and is used with a mobile phone, a user can talk on the phone wirelessly in a hands-free way while driving a car or the like.

FIG. 12C illustrates a computer which includes a main body 9201 including a CPU, a housing 9202, a display portion 9203, a keyboard 9204, an external connection port 9205, a pointing device 9206, and the like. The computer includes a semiconductor device manufactured according to one embodiment of the present invention for the display portion 9203. When the CPU described in Embodiment 5 is used, power consumption of the computer can be reduced.

Figure 13A:
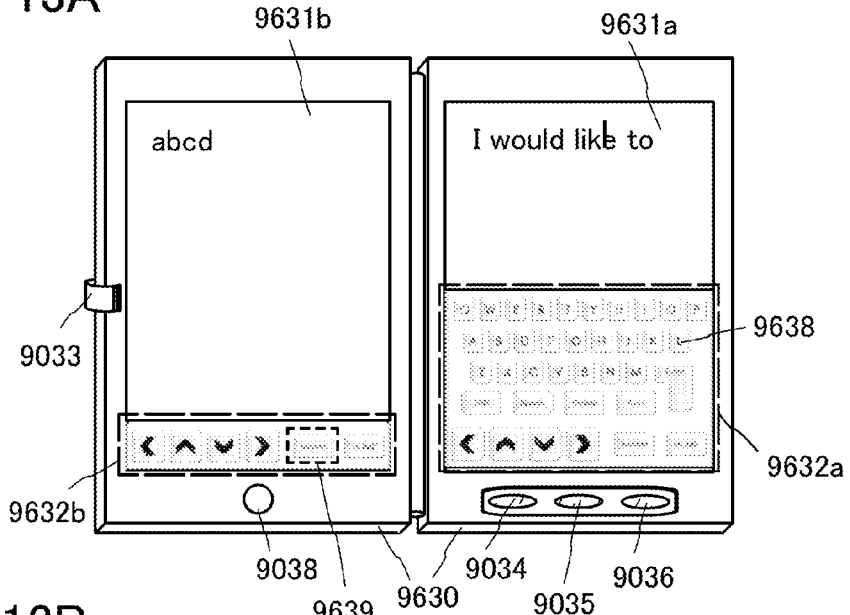
FIGS. 13A to 13C illustrate an electronic device.
Figure 13B:
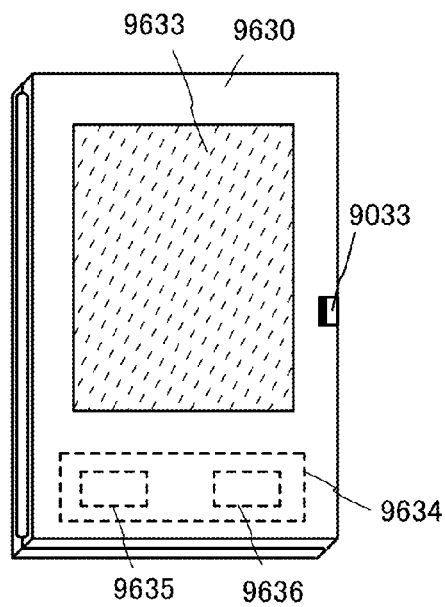

FIGS. 13A and 13B illustrate a tablet terminal that can be folded. In FIG. 13A, the tablet terminal is opened, and includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 13A and 13B, an SRAM or a DRAM is used as a memory for temporarily storing image data. For example, the semiconductor device described in Embodiment 3 or 4 can be used as a memory. The semiconductor device described in the above embodiment employed for the memory enables writing and reading of data to be performed at high speed, enables data to be held for a long time, and enables power consumption to be sufficiently reduced.

A touch panel region 9632a can be provided in a part of the display portion 9631a, in which data can be input by touching displayed operation keys 9638. Note that FIG. 10 shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Note that FIG. 13A shows an example in which the display portion 9631a and the display portion 9631b have the same display area; however, without limitation thereon, one of the display portions may be different from the other display portion in size and display quality. For example, one of them may be a display panel that can display higher-definition images than the other.

The tablet terminal is closed in FIG. 13B. The tablet terminal includes the housing 9630, a solar battery 9633, a charge/discharge control circuit 9634, a battery 9635, and a DCDC converter 9636. Note that FIG. 13B shows an example in which the charge and discharge control circuit 9634 includes the battery 9635 and the DCDC converter 9636.

Since the tablet terminal can be folded, the housing 9630 can be closed when the tablet terminal is not in use. Thus, the display portions 9631a and 9631b can be protected, thereby providing a tablet terminal with high endurance and high reliability for long-term use.

In addition, the tablet terminal illustrated in FIGS. 13A and 13B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

Figure 13C:
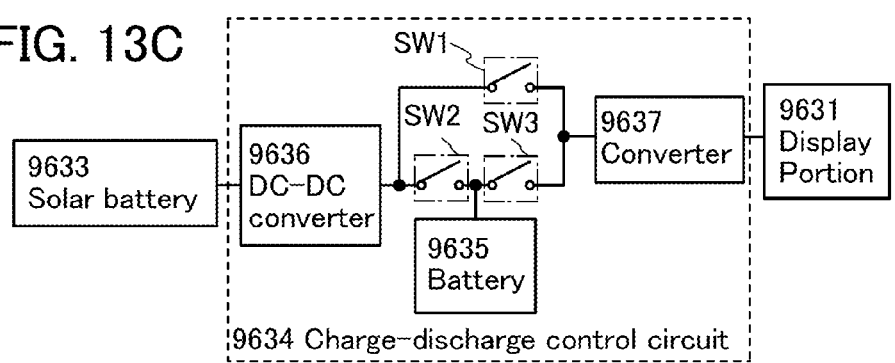

The structure and the operation of the charge/discharge control circuit 9634 illustrated in FIG. 13B are described with reference to a block diagram in FIG. 13C. The solar battery 9633, the battery 9635, the DCDC converter 9636, a converter 9637, switches SW1 to SW3, and the display portion 9631 are shown in FIG. 13C, and the battery 9635, the DCDC converter 9636, the converter 9637, and the switches SW1 to SW3 correspond to the charge/discharge control circuit 9634 in FIG. 13B.

First, an example of operation in the case where power is generated by the solar battery 9633 using external light is described. The voltage of power generated by the solar battery is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Figure 14A:
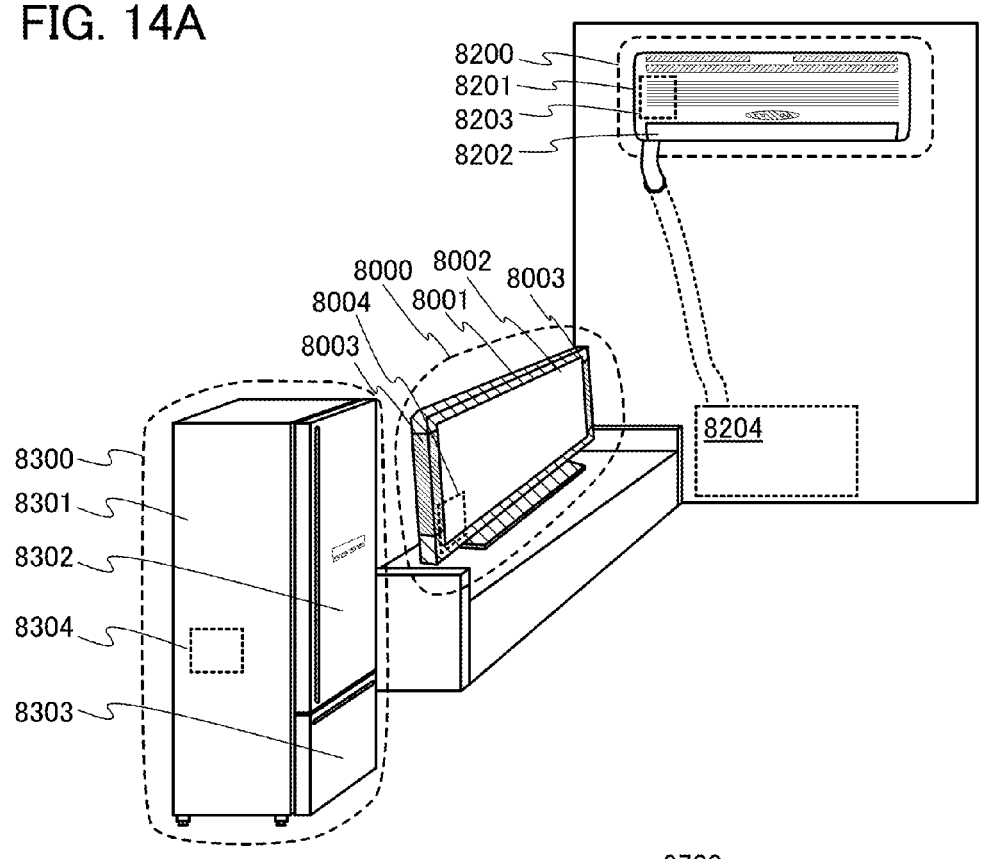
FIGS. 14A to 14C illustrate electronic devices.

In a television set 8000 in FIG. 14A, a display portion 8002 is incorporated in a housing 8001. The display portion 8002 displays an image and a speaker portion 8003 can output sound. The transistor described in Embodiment 1 or 2 can be used for the display portion 8002.

A semiconductor display device such as a liquid crystal display device, a light-emitting device in which a light-emitting element such as an organic EL element is provided in each pixel, an electrophoretic display device, a digital micromirror device (DMD), a plasma display panel (PDP), or a field emission display (FED) can be used for the display portion 8002.

The television set 8000 may be provided with a receiver, a modem, and the like. With the receiver, the television set 8000 can receive a general television broadcast. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. Any of the memories and the CPU described in Embodiments 3 to 5 can be used for the television set 8000.

In FIG. 14A, an air conditioner which includes an indoor unit 8200 and an outdoor unit 8204 is an example of an electric device in which the CPU of Embodiment 5 is used. Specifically, the indoor unit 8200 includes a housing 8201, an air outlet 8202, a CPU 8203, and the like. Although the CPU 8203 is provided in the indoor unit 8200 in FIG. 14A, the CPU 8203 may be provided in the outdoor unit 8204. Alternatively, the CPU 8203 may be provided in both the indoor unit 8200 and the outdoor unit 8204. Since the CPU of Embodiment 5 is formed using an oxide semiconductor, an air conditioner which has excellent heat resistance property and high reliability can be provided with the use of the CPU.

In FIG. 14A, an electric refrigerator-freezer 8300 is an example of an electric device which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 14A, the CPU 8304 is provided in the housing 8301. When the CPU described in Embodiment 5 is used as the CPU 8304 of the electric refrigerator-freezer 8300, power consumption of the electric refrigerator-freezer 8300 can be reduced.

Figure 14B:
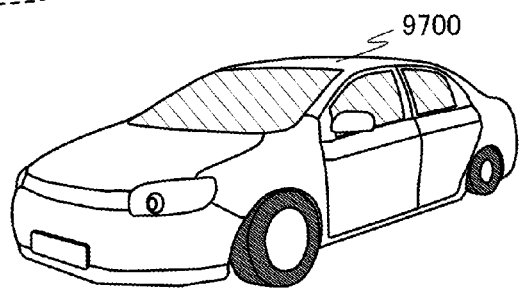
Figure 14C:
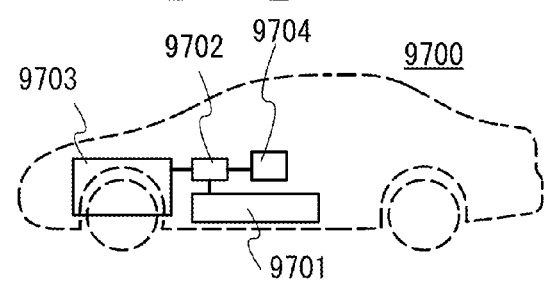

FIG. 14B illustrates an example of an electric vehicle which is an example of an electric device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the CPU described in Embodiment 5 is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The methods and structures described in this embodiment can be combined as appropriate with any of the methods and structures described in the other embodiments.

This application is based on Japanese Patent Application serial no. 2012-025469 filed with Japan Patent Office on Feb. 8, 2012, the entire contents of which are hereby incorporated by reference.

What is claimed is:

1. A semiconductor device comprising:
an oxide semiconductor layer in which a channel formation region of a transistor is localized;
a gate electrode layer over the oxide semiconductor layer and overlapping with the oxide semiconductor layer;
a gate insulating layer interposed between the oxide semiconductor layer and the gate electrode layer; and
a first insulating layer on and in contact with a part of an upper surface of the oxide semiconductor layer, a side surface of the gate insulating layer and a side surface of the gate electrode layer,
wherein the gate insulating layer includes an oxygen-excess region,
wherein the first insulating layer has a lower oxygen-transmitting property than the gate insulating layer, and
wherein the first insulating layer has a thickness greater than or equal to 5 nm and less than or equal to 10 nm.

2. The semiconductor device according to claim 1,
wherein the gate insulating layer comprises silicon and oxygen, and
wherein the first insulating layer comprises aluminum and oxygen.

3. The semiconductor device according to claim 1, wherein, in the vicinity of the gate electrode layer, a dielectric environment of a source region side of the oxide semiconductor layer is substantially identical to a dielectric environment of a drain region side of the oxide semiconductor layer.

4. A semiconductor device comprising:
an oxide semiconductor layer in which a channel formation region of a transistor is localized;
a gate electrode layer over the oxide semiconductor layer and overlapping with the oxide semiconductor layer;
a gate insulating layer interposed between the oxide semiconductor layer and the gate electrode layer;
a first insulating layer on and in contact with a part of an upper surface of the oxide semiconductor layer, a side surface of the gate insulating layer and a side surface and an upper surface of the gate electrode layer; and
a second insulating layer on the side surface of the first insulating layer,
wherein side end portions of the first insulating layer are aligned with side end portions of the second insulating layer,
wherein the gate insulating layer includes an oxygen-excess region,
wherein the first insulating layer has a lower oxygen-transmitting property than the gate insulating layer, and
wherein the first insulating layer has a thickness greater than or equal to 5 nm and less than or equal to 10 nm.

5. The semiconductor device according to claim 4, wherein the first insulating layer is a metal oxide film.

6. The semiconductor device according to claim 4, wherein the first insulating layer is an aluminum oxide film.

7. A memory device including the semiconductor device according to claim 4.

8. The semiconductor device according to claim 4, further comprising a third insulating layer covering the oxide semiconductor layer, the gate electrode layer, the first insulating layer, and the second insulating layer.

9. The semiconductor device according to claim 8, further comprising a source electrode layer and a drain electrode layer of the transistor on and in contact with the third insulating layer and in electrical contact with the oxide semiconductor layer.

10. The semiconductor device according to claim 9, wherein the semiconductor device is configured so that, in the vicinity of the gate electrode layer, dielectric characteristics of portions overlapping the oxide semiconductor layer and comprised between the oxide semiconductor layer and the third insulating layer are substantially identical on a source side of the oxide semiconductor layer with respect to the gate electrode layer and on a drain side of the oxide semiconductor layer with respect to the gate electrode layer.

11. A semiconductor device comprising:
an oxide semiconductor layer which is non-single-crystal and includes a crystalline component, and in which a channel formation region of a transistor is localized;
a gate electrode layer over the oxide semiconductor layer and overlapping with the oxide semiconductor layer;
a gate insulating layer interposed between the oxide semiconductor layer and the gate electrode layer;
a first insulating layer on and in contact with a part of an upper surface of the oxide semiconductor layer, a side surface of the gate insulating layer and a side surface and an upper surface of the gate electrode layer; and
a second insulating layer on the side surface of the first insulating layer,
wherein side end portions of the first insulating layer are aligned with side end portions of the second insulating layer,
wherein the gate insulating layer includes an oxygen-excess region,
wherein the first insulating layer has a lower oxygen-transmitting property than the gate insulating layer, and
wherein the first insulating layer has a thickness greater than or equal to 5 nm and less than or equal to 10 nm.

12. The semiconductor device according to claim 11, wherein in the crystalline component, a c-axis is aligned in a direction parallel to a normal vector of a surface on which the oxide semiconductor layer is formed or a normal vector of a surface of the oxide semiconductor layer.

13. The semiconductor device according to claim 11, wherein the first insulating layer is a metal oxide film.

14. The semiconductor device according to claim 11, wherein the first insulating layer is an aluminum oxide film.

15. A memory device including the semiconductor device according to claim 11.

16. The semiconductor device according to claim 11, further comprising a third insulating layer covering the oxide semiconductor layer, the gate electrode layer, the first insulating layer, and the second insulating layer.

17. The semiconductor device according to claim 16, further comprising a source electrode layer and a drain electrode layer of the transistor on and in contact with the third insulating layer and in electrical contact with the oxide semiconductor layer.

18. The semiconductor device according to claim 17,
wherein the source electrode layer and the drain electrode layer are in direct contact with the oxide semiconductor layer,
wherein, in regions of the oxide semiconductor layer in direct contact with the source electrode layer and the drain electrode layer, a ratio of a content of the crystalline component to a content of an amorphous component is lower than in a region overlapping with the gate insulating layer.

19. The semiconductor device according to claim 17, wherein the semiconductor device is configured so that, in the vicinity of the gate electrode layer, dielectric characteristics of portions overlapping the oxide semiconductor layer and comprised between the oxide semiconductor layer and the third insulating layer are substantially identical on a source side of the oxide semiconductor layer with respect to the gate electrode layer and on a drain side of the oxide semiconductor layer with respect to the gate electrode layer.

* * * * *